United States Patent
Wolkow et al.

(10) Patent No.: US 10,937,959 B2
(45) Date of Patent: Mar. 2, 2021

(54) MULTIPLE SILICON ATOM QUANTUM DOT AND DEVICES INCLUSIVE THEREOF

(71) Applicant: Quantum Silicon Inc., Edmonton (CA)

(72) Inventors: Robert A. Wolkow, Edmonton (CA); Roshan Achal, Edmonton (CA); Taleana Huff, Edmonton (CA); Hatem Labidi, Edmonton (CA); Lucian Livadaru, Edmonton (CA); Paul Piva, Edmonton (CA); Mohammad Rashidi, Edmonton (CA)

(73) Assignee: QUANTUM SILICON INC., Edmonton (CA)

( * ) Notice: Subject to any disclaimer, the term of this patent is extended or adjusted under 35 U.S.C. 154(b) by 114 days.

(21) Appl. No.: 16/318,626

(22) PCT Filed: Jul. 19, 2017

(86) PCT No.: PCT/IB2017/001051
§ 371 (c)(1),
(2) Date: Jan. 17, 2019

(87) PCT Pub. No.: WO2018/015809
PCT Pub. Date: Jan. 25, 2018

(65) Prior Publication Data
US 2020/0044150 A1 Feb. 6, 2020

Related U.S. Application Data

(60) Provisional application No. 62/379,164, filed on Aug. 24, 2016, provisional application No. 62/364,206, filed on Jul. 19, 2016.

(51) Int. Cl.
*H01L 45/00* (2006.01)
*H01L 27/24* (2006.01)
(Continued)

(52) U.S. Cl.
CPC .......... *H01L 45/10* (2013.01); *H01L 27/2463* (2013.01); *H01L 29/127* (2013.01);
(Continued)

(58) Field of Classification Search
CPC ............. H01L 27/2463; H01L 27/2481; H01L 29/127; H01L 29/16; H01L 29/34;
(Continued)

(56) References Cited

U.S. PATENT DOCUMENTS 6,114,762 A * 9/2000 Watanabe ............. H01L 49/006
257/734
6,348,700 B1 2/2002 Ellenbogen et al.
(Continued)

FOREIGN PATENT DOCUMENTS

WO 2009/153669 A2 12/2009

OTHER PUBLICATIONS

Extended EU Search Report dated Feb. 5, 2020 in copending EU Patent Appln. No. 17830552.0.
(Continued)

*Primary Examiner* — Stephen W Smoot
(74) *Attorney, Agent, or Firm* — Blue Filament Law PLLC

(57) ABSTRACT

A multiple-atom silicon quantum dot is provided that includes multiple dangling bonds on an otherwise H-terminated silicon surface, each dangling bonds having one of three ionization states of +1, 0 or −1 and corresponding respectively to 0, 1, or 2 electrons in a dangling bond state. The dangling bonds together in close proximity and having the dangling bond states energetically in the silicon band gap with selective control of the ionization state of one of the dangling bonds. A new class of electronics elements is provided through the inclusion of at least one input and at least one output to the multiple dangling bonds. Selective modification or creation of a dangling bond is also detailed.

26 Claims, 35 Drawing Sheets

(51) Int. Cl.
  *H01L 29/66* (2006.01)
  *H01L 29/34* (2006.01)
  *H01L 29/12* (2006.01)
  *H01L 29/76* (2006.01)
  *H01L 49/00* (2006.01)
  *B82Y 10/00* (2011.01)
  *B82Y 30/00* (2011.01)

(52) U.S. Cl.
  CPC ........ *H01L 29/34* (2013.01); *H01L 29/66439* (2013.01); *H01L 29/66977* (2013.01); *H01L 29/7613* (2013.01); *H01L 49/006* (2013.01); *B82Y 10/00* (2013.01); *B82Y 30/00* (2013.01); *Y10S 977/754* (2013.01); *Y10S 977/933* (2013.01); *Y10S 977/937* (2013.01)

(58) Field of Classification Search
  CPC ......... H01L 29/66439; H01L 29/66977; H01L 29/7613; H01L 45/10; H01L 45/1206; H01L 45/1273; H01L 45/148; H01L 49/006; B82Y 10/00; B82Y 30/00; Y10S 977/754; Y10S 977/814; Y10S 977/933; Y10S 977/935; Y10S 977/937
  See application file for complete search history.

(56) References Cited

U.S. PATENT DOCUMENTS

| | | | |
|---|---|---|---|
| 6,682,951 B1 | 1/2004 | Lutz | |
| 2008/0187480 A1* | 8/2008 | Nayfeh | H01S 5/30 |
| | | | 423/348 |
| 2008/0191718 A1* | 8/2008 | Wolkow | H01L 51/0508 |
| | | | 324/691 |
| 2011/0084251 A1* | 4/2011 | Dilabio | B82Y 10/00 |
| | | | 257/23 |
| 2014/0084303 A1* | 3/2014 | Shimizu | H01L 29/66068 |
| | | | 257/77 |

OTHER PUBLICATIONS

Lucian Livadaru et al: "Dangling-bond charge qubit on a silicon surface", New Journal of Physics, Institute of Physics Publishing, Bristol, GB, vol. 12, No. 8, Aug. 9, 2010 (Aug. 9, 2010), p. 83018, XP020183036, ISSN: 1367-2630.

S. R. Schofield et al: "Quantum engineering at the silicon surface using dangling bonds", Nature Communications, vol. 4, No. 1, Apr. 3, 2013 (Apr. 3, 2013), XP055661140.

Lent C S et al: "A Device Architecture 8-14 for Computing With Quantum Dots", Proceedings of the IEEE, IEEE. New York, US, vol. 85, No. 4, Apr. 1, 1997 (Apr. 1, 1997), pp. 541-557, XP000698876, ISSN: 0018-9219.

Roth S et al: "Molecular Rectifiers and 8-14 Transistors Based on Pi-Conjugated Materials", Synthetic Metals, Elsevier Sequoia, Lausanne, CH, vol. 94, No. 1, Apr. 15, 1998 (Apr. 15, 1998), pp. 105-110, XP001004861, ISSN: 0379-6779.

Wolkow, Robert A. et al., "Silicon Atomic Quantum Dots Enable Beyond-CMOS Electronics", pp. 1-28, Dec. 6, 2013; arXiv.org; retrieved on Dec. 20, 2017.

Taucer, Marco et al., "Single Electron Dynamics of an Atomic Silicon Quantum Dot on the H—Si(100) 2×1 Surface"; pp. 1-7; Jan. 30, 2014; arXiv.org; DOI: 10.1103/PhysRevLett.112.256801; retrieved on Dec. 20, 2017.

International Search Report dated Jan. 15, 2018 for International Application No. PCT/IB2017/001051 filed Jul. 19, 2017.

* cited by examiner

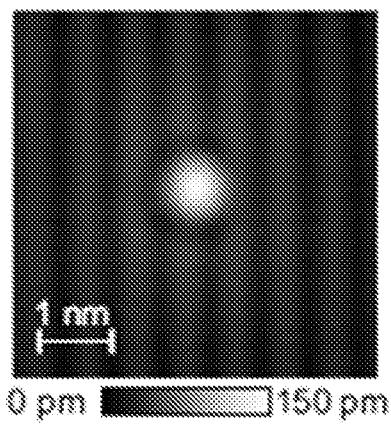 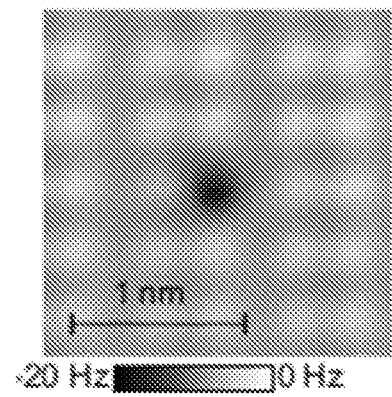
FIG. 6A　　　　　　　　　　　　FIG. 6B
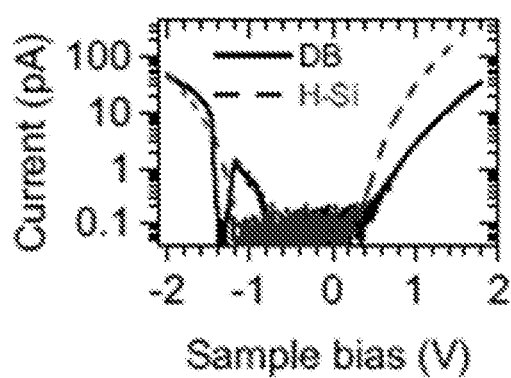 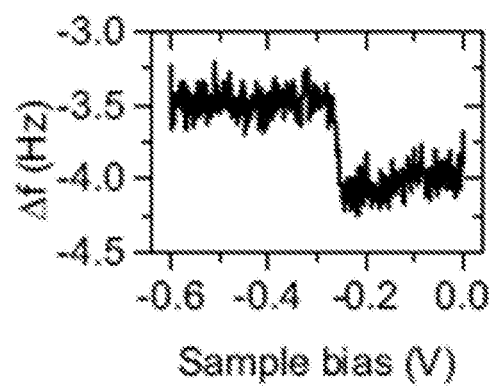
FIG. 6C　　　　　　　　　　　　FIG. 6D

H Functionalized Tip

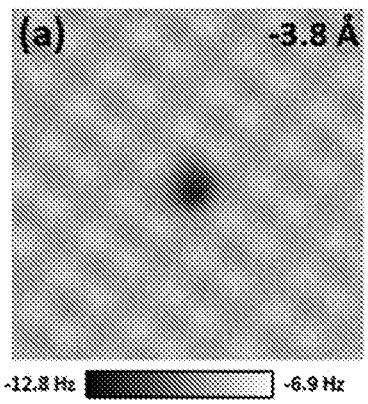 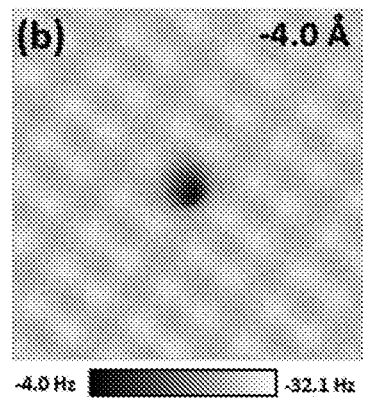 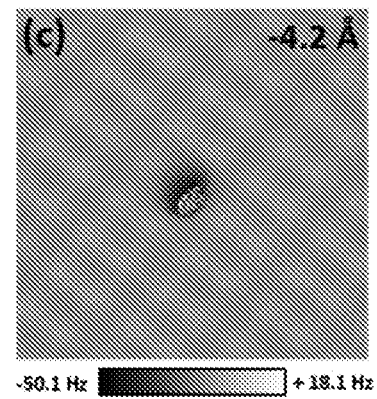
FIG. 16A    FIG. 16B    FIG. 16C
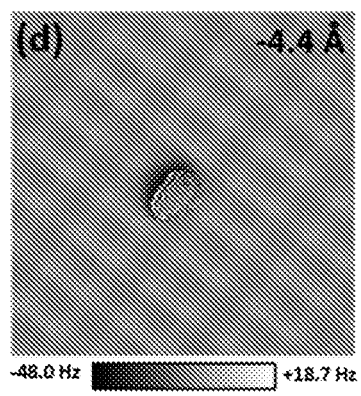 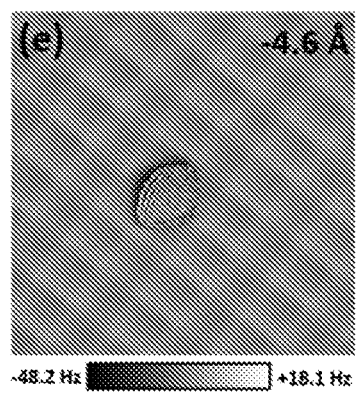
FIG. 16D    FIG. 16E

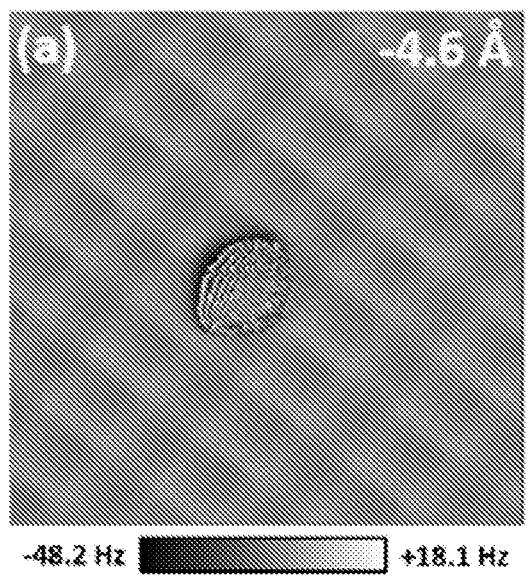
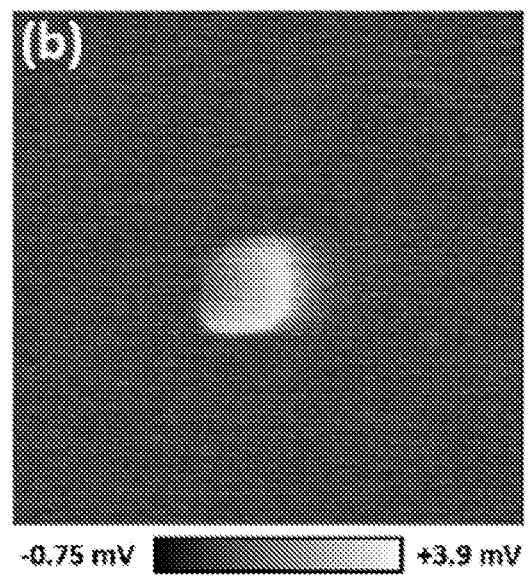
FIG. 17A　　　　　　　　　　FIG. 17B
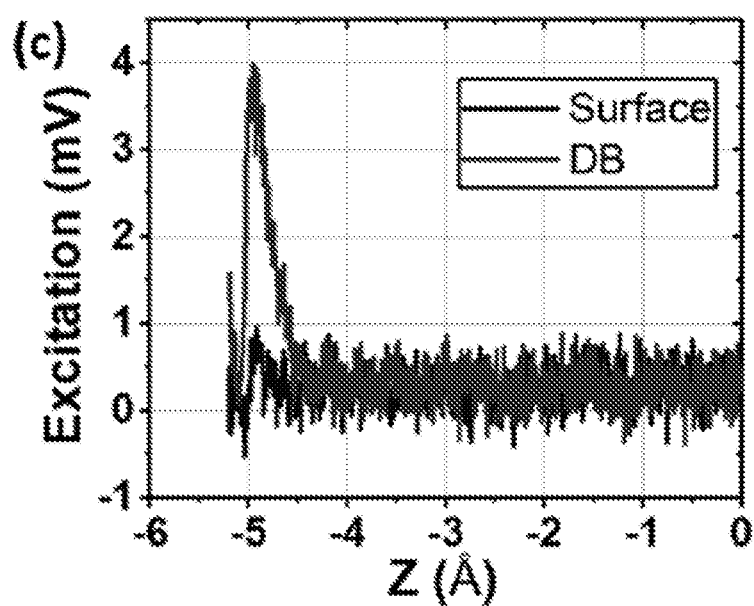
FIG. 17C

MULTIPLE SILICON ATOM QUANTUM DOT AND DEVICES INCLUSIVE THEREOF

FIELD OF THE INVENTION

The present invention is directed generally to multiple dangling bonds (DBs) on an otherwise H-terminated silicon surface that form quantum dots and in particular to devices based on the modulation of the occupation state of a DB on such a quantum dot.

BACKGROUND

Using scanning probe microscopy techniques, inducing and visualizing chemical reactions at the atomic scale is routinely achievable. In the framework of so-called mechanochemistry, (1) mechanical force induced reactions have been studied using NCAFM. (2) Recent works reported force induced atomic-scale switching, (3) quantitative force measurements to induce the diffusion of single atoms (4) and molecules, (5) as well as studying molecular conformers (6) and tautomerization. (7) Other studies have shown examples of mechanically induced vertical manipulation of single atoms. (8, 9) However, direct observation of mechanically induced covalent bonding of two different atoms using NC-AFM remain scarce. (10)

Recently, the silicon dangling bond (DB) on the technologically relevant H—Si(100) surface was established as a very promising building block for beyond CMOS technology.(11, 12) A DB corresponds to a desorbed single hydrogen atom from the otherwise passivated silicon surface. It is approximately an sp3 hybrid orbital that can be occupied by 2, 1, or 0 electrons resulting, respectively, in a negative, neutral, or positively charged DB. Thus, a DB behaves essentially as a single atom quantum dot, with charge state transitions reported in STM experiments.(13, 14) DBs can be found natively on the surface as a result of imperfections during the hydrogen termination procedure or artificially created using the STM tip. Different works have shown that controlled atom-by-atom lithography, i.e. hydrogen desorption, on the H—Si surface allows creation of DB based circuits for next generation ultimately miniaturized low power nanoelectronic devices. (11, 12, 15-17)

Although STM tip induced desorption of hydrogen from the H—Si(100) surface has been extensively studied,(16, 18-23) the reverse manipulation of selective adsorption of a single hydrogen atom to passivate a silicon DB remains to be explored. In this context, AFM can bring more insights by allowing identification of different tip dynamics (24, 25) and probing chemical reactivity at the atomic scale. (26, 27)

The promise of atom scale computing first became a possibility when Eigler et al. controllably moved atoms on a surface to achieve structures of their design (1). In a subsequent work, the same lab made molecular cascades where, in analogy to falling dominoes, a terminal molecule was tipped to, in turn, tip over a neighboring molecule, which tipped the next molecule, and so on (2). Separate branches of the cascade were delicately timed to come together in such a way as to achieve binary logic functions. With these results a new era was begun. However, challenges preventing practical applications remained and those limitations have been very difficult to overcome. Some of those challenges are; 1) the need to have the patterned atoms be robust at practical operation temperatures ideally room temperature. The initial atomic patterns were very delicately bound and would not persist above about −250° C. (1, 2). In general, atom fabrication of structures robust enough to withstand relatively high operating temperature are more difficult to make. This is because larger energy inputs from the scanned probe are required to dislodge and move strongly bound atoms, and under such conditions covalent bonds within the probe itself break with some probability comparable to that of the target bond (3). 2) The patterned atoms need to be electrically distinct from the substrate so as to enable conduction pathways that are not shorted-out or altered by the substrate. Studies performed on metals (4, 5), the most common choice, were therefore limited in that regard. Isolation has been achieved in studies of metal atoms and of molecules separated from a metal substrate by a salt layer, but these have their limitations in uniformity of layer thickness and issues with spontaneous loss of charge to the substrate (6, 7). 3) The atomic circuitry must not require mechanical or other reset processes (analogous to standing all the dominoes back up) that would prevent the circuitry being instantly reusable.

SUMMARY OF THE INVENTION

A multiple-atom silicon quantum dot is provided that includes multiple dangling bonds on an otherwise H-terminated silicon surface, each dangling bonds having one of three ionization states of +1, 0 or −1 and corresponding respectively to 0, 1, or 2 electrons in a dangling bond state. The dangling bonds together in close proximity and having the dangling bond states energetically in the silicon band gap with selective control of the ionization state of one of the dangling bonds. A new class of electronics elements is provided through the inclusion of at least one input and at least one output to the multiple dangling bonds. Selective modification or creation of a dangling bond is also detailed.

BRIEF DESCRIPTION OF THE DRAWINGS

FIGS. 6A-6D show Probing charge State Transition in an Atomic SiliconQuantum Dot using NC-AFM. FIG. 6A shows a 3×3 nm filled states STM image (−1.7 V and 50 pA) and FIG. 6B corresponding frequency shift map at 0 V of an ASiQD (zrel=−350 p.m and Amp=100 p.m). FIG. 6C shows Current vs. Bias spectroscopy plotted in log scale of the ASiQD (black) and hydrogen terminated surface (red). FIG. 6D shows frequency shift as a function of voltage measured above the ASiQD.

FIG. 8A shows Filled states STM image and FIG. 8B corresponding frequency shift maps of a 17 ASiQD wire. Color guides are placed in FIG. 8B to show the location of the dots. FIG. 8C shows symmetric 18 atom ASiQD wire creating from adding on the right of FIG. 8A. FIG. 8D is a frequency shift map of the dots showing the symmetry splitting plane marked by the dashed white line FIG. 8E 19 atom wire with symmetry broken by adding a ASiQD on the left. FIG. 8F is a frequency shift map showing the wire polarized to the right. All STM images were taken at V −1.7 and 50 pA. All AFM images were taken at 0 V, with a relative tip elevation of z=330 p.m and an oscillation amplitude of 0.5° A.

FIGS. 9A-9O show examples of a functional OR gate constructed using atomic silicon quantum dots (ASiQD). FIGS. 9A, 9D, 9G, 9J, and 9M show constant current filled states STM images (−1.8V, 50 pA) of the OR gate, and FIGS. 9B, 9E, 9H, 9K, and 9N show the corresponding frequency shift maps (0V, Z 3.5 A°). FIG. 9C shows the truth table of an OR gate, while FIGS. 9F, 9I, 9L, and 9O show models for the switching inputs and outputs corresponding to the various gate states displayed.

FIG. 10A shows a ball and stick model of the H—Si(100)−2×1 surface. FIG. 10B shows typical defect-free empty states STM image using a non-functionalized tip and showing the dimer structure of the surface. The red dot indicates the position of the STM tip when the electronic excitation sketched in FIG. 10A is applied. FIG. 10C shows a ball and stick model of a silicon dangling bond in green and a H-functionalized tip resulting from the tip-induced desorption. FIG. 10D shows typical STM image of a DB acquired with a H-functionalized tip showing a characteristic STM contrast enhancement. Both STM images were acquired in constant current mode with a set point of 50 pA at +1.3 V.

FIG. 11A shows a $(5×5)$ nm$^2$ STM image at +1.3 V of a DB where the desorbed atomic hydrogen was not picked up, instead adsorbing at the location indicated by an arrow. FIG. 11B shows a $(3×3)$ nm$^2$ STM image of an atomic hydrogen adsorbed on the surface and FIG. 11C shows a corresponding AFM frequency shift map at 0 V and a relative tip elevation of z=−3.8 Å. FIG. 11D shows an atomic hydrogen on the surface is picked up by a slow downward STM scan at V=+1.6V. All STM images are constant current at 50 pA.

FIG. 12A shows a typical filled states STM image of a silicon dangling bond on the H—Si(100)−2×1 surface using a single hydrogen atom functionalized tip. The yellow arrow indicates a defect taken as a reference. FIG. 12B shows a Δf(z) curve using H-functionalized tip on a surface hydrogen atom. FIG. 12C shows a ball and stick model and FIG. 12D shows a Δf(z) curve on a single DB during the mechanically induced Si—H covalent bond capping event. The orange arrow indicates a hysteresis (zoom in inset) characteristic of the change that occurs due to the formation of the covalent bond between the H atom at the tip apex and the silicon dangling bond. FIG. 12E shows a STM image and FIG. 12F shows a Δf(z) curve on the H—Si surface subsequent to the mechanically induced reaction in FIG. 12D.

FIG. 13A shows a Δf(z) curves recorded on the H—Si surface (blue curve) and on the silicon DB (red curve). $(3×3)$ nm$^2$ frequency shift maps of a DB on the H—Si surface at relatively large FIG. 13B and small FIG. 13C tip-sample distances respectively. All data was acquired at 0 V with an oscillation amplitude of 1 Å.

FIG. 14A shows two pairs of coupled DBs on the H—Si(100) surface arranged along a same dimer row. FIG. 14B shown an image of the same area after the mechanically induced capping of the far right DB in FIG. 14A. 14C shows a $(3×2)$ nm$^2$ STM image of three tunnel-coupled DBs. FIG. 14B shows the same area after erasing the middle DB in FIG. 14C. Constant current images FIGS. 14A-14D were acquired at −1.8 V and 50 pA. FIGS. 14E-14F shows filled (−2.0 V, 50 pA) and FIGS. 14g-14H show empty (+1.4 V, 50 pA) states STM images of a DB wire, respectively, before and after erasing the far right DB in FIG. 14E. 3d models of the four (FIG. 14I) and three (FIG. 14J) DB wire. Positions of erased DBs are indicated by dotted circles.

FIGS. 16A-16E show a series of raw (3×3) nm² NC-AFM frequency shift maps of H—Si(100) surface at different tip-sample elevations. Images were recorded at 0 V and with an oscillation amplitude of 1 Å. FIGS. 16A-16E show the evolution from atomic to chemical bond contrast on the H—Si surface. For smaller tip elevations, much higher interaction force is seen on the DB than elsewhere on the surface. Z=0 Å corresponds to the tip position defined by the STM imaging set points (30 pA and +1.3 V) before switching off the feedback loop.

FIG. 17A shows a NC-AFM frequency shift map of a single DB at small tip-sample distance (−4.6 Å) and FIG. 17B shows corresponding simultaneously obtained excitation channel map. FIG. 17C shows a superposed excitation versus tip elevation curves recorded on the same DB (red curve) and on the H—Si surface (blue curve).

FIG. 18A shows a (20×20) nm² constant current (30 pA, −2.0V) STM image of the H—Si surface with a (5×5) nm² bare silicon area appearing as a bright square at the center of the image, and obtained with tip-induced hydrogen desorption. Following tip shaping procedure, the STM image becomes very sharp (FIG. 18B) and no longer shows the double tip effect visible in FIG. 18A. Red arrows indicate the location of the tip-induced silicon dimer hydrogen termination. FIGS. 18 C and 18D show frequency shift versus tip-sample distance of a reactive and a passivated tip, respectively.

FIG. 19A shows a ball and stick model showing three silicon layers of the H—Si surface in the 2×1 reconstruction. FIG. 19B shows a (2×2) nm² constant current (30 pA, +2 V) STM image acquired with a passivated tip. FIG. 19C-H show a series of raw NC-AFM frequency shift maps of H—Si surface at different tip elevations. Images are recorded at 0V and with an oscillation amplitude of 1 Å.

FIG. 20A shows a tip structure and H—Si slab considered in the DFTB calculations. FIGS. 20B and 20C show a series of simulated (2×2) nm² force maps at different elevations using a rigid and a flexible tip, respectively.

DESCRIPTION OF THE INVENTION

Figure 1:
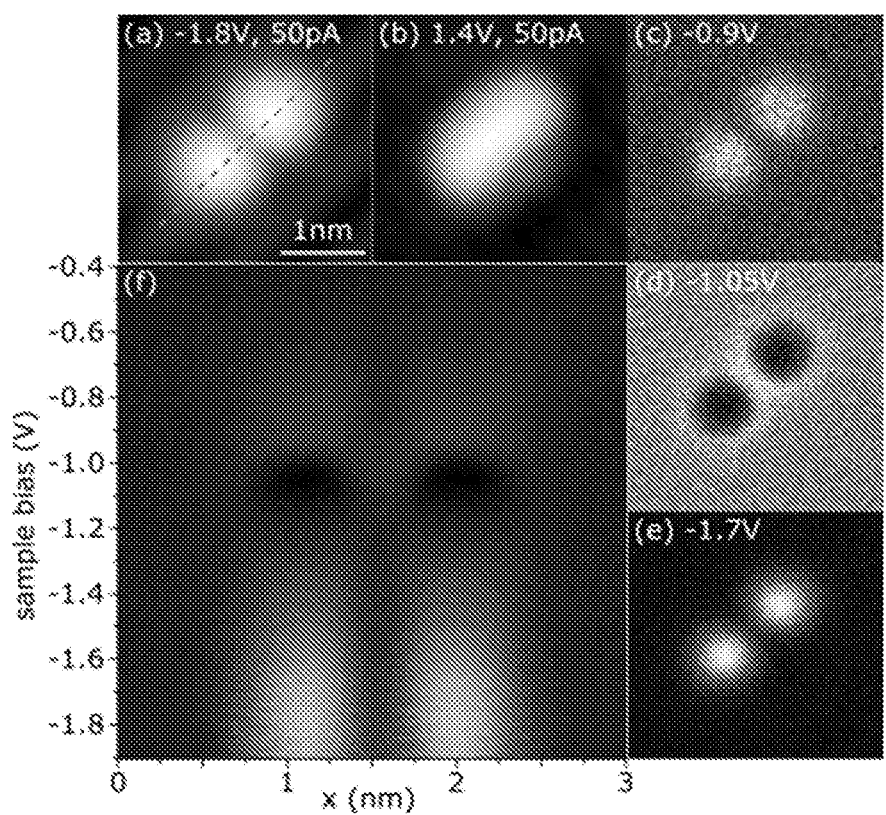
FIG. 1 shows a 3 DB Chain (a,b) STM constant current images at −1.8V and 1.4V respectively. The current setpoint was 50 pA. (c-e) dI/dV maps taken at a tip height of −1.8V, 20 pA with a 60 pm tip retraction over an H—Si dimer. The sample bias during collection of each dI/dV map is labelled in the upper left corner of the map. The scale bar for the STM images and the dI/dV maps is shown in (a). (f) dI/dV line scans at varying energy along the 3 nm dotted line overlaid on the STM image (a).

The present invention has utility as a multi-silicon atom quantum dot (ASiQD) that is a collection of either as close spaced as the crystalline silicon substrate lattice allows, or with intervening spaces which are populated by H atom-terminated surface silicon atoms, to form an elongated, or simply long, quantum dot. The dangling bonds that are the operational elements of the present invention are not H atom terminated.

It is appreciated that other shapes, any the lattice allows for, can also be made. These can be termed ASiMs, for atomic silicon molecules. Additional shapes include V-shapes, Y-shapes, triangles, squares, and rectangles.

As used herein, a quantum dot is defined as having collective electronic energy levels and is an artificial molecule.

The long quantum dot can be a linear arrangement or any other shape the lattice allows. An artificial benzene of ASiQDs has been created. Simple linear close packed arrangement consisting of 2, 3, 4, 5, 6, 7 ASiQDs have been formed and characterised with dI/dV maps covering a range of voltages and a spatial line spanning the length of the molecule. Constant current, constant height and dI/dV over an area larger than the molecule have all been recorded. These images show the spatial and energetic variations of the collective molecular states of the ensembles.

All the attributes of molecules and uses thereof, the inventive ASiMs has like attributes and uses. An inventive ASiM is tailored, and is formed to have specific light absorption and emission properties.

Molecules have the attributes of: being polarized with an electric field to exhibit a field distorted electronic structure, being ionized either by adding or subtracting electrons, and entering into chemical reactions. In attributes of ASiMs that allow them to serve as electronic components in classical binary or analog circuitry or as coherent electron elements with quantum circuitry include: an electric field induced altered electronic structure is used in some inventive embodiments to convey an action at a distance; a perturbation, or a signal input at one end or region of an ASiM can be registered elsewhere on the ASiM; a receptor or detector of that alteration can effectively complete a transmission of information; and multiple inputs along a ASiM can diversely and programmatically alter the electronic structure so as to achieve a computation which can be registered by receptors at one or more other points on the ASiM. Collections of inventive ASiMs, or equivalently, molecules with gaps? spacing, can exhibit profound shifts in electronic structure in response to perturbations: such molecules can exhibit 2 state binary behavior, or, continuously variable electronic behavior with a very large polarization range; in a binary application, a linear wire like molecule, or a more complex shape composed of many such contiguous line segments, will exhibit two longitudinally shifted electronic states, and those can be used to represent, store and transmit binary information; and in a quantum electronic application, the same structure types as above can couple distant qubits, with either sign of coupling, in a way known as J coupling. Typically, J coupling refers to coupling between two spins, such as in an Ising model. Such J coupling is analogous to capacitive coupling in an electric circuit and is often referred to as ZZ coupling in the quantum computing literature. Variants on ASiM based couplers also allow inductive-like coupling known as XX coupling. Other variants too can be made. Access to diverse types, strengths and sign of coupling allows for more diverse, more nearly universal quantum computing.

Fabricating ASiMs where and as needed represents a new, practical expression of what has been termed molecular electronics. Unlike previous attempts, where molecular chemistry is laborious and mostly unsuccessfully guided into a desired position, the present invention achieves positioning and interfacing to wire contacts and other components by making the wire and other components where and as needed. The inventive quantum dots and related interfacial components can be tailored so as to have the dimensions, content and properties desired.

An important property of the ASiQDs is that its electronic states are in the crystalline silicon band gap. Likewise, ASiMs have new collective states that are also in the band gap. The splitting associated with bonding among ASiQDs is of order 0.1 eV limiting the molecular states to the gap region as well.

Crucially, the collective states of the ASiMs therefore do not effectively mix with silicon bulk electronic states, allowing for atom sized wires and other electric classical and quantum elements to be formed on the silicon surface and be largely electrical insulated and decoupled from the bulk without the need for an intervening insulator.

The elimination of the need for an insulator enormously reduces the dimensions of a conductor that can be routed over a silicon surface, while also allowing the atom size conductor to be perfectly ordered with respect to the underlying silicon lattice.

The perfect order and small overall size of such wires and other elements allows or identical structures to be fabricated. Identical structures have homogenous properties. Circuits and devices composed of elements with homogeneous properties have themselves far more predictable properties than devices and circuits made of elements with a range of properties.

Single electron transistors can be made of ASiQDs (SEM ASiM). The SEM ASiM includes at least two densely packed wire units with one or more atoms serving as a quantum dot in the centre. SET circuits in the past, made by lithographic techniques, have had such wide variation in properties among SETs that no circuit built of a collective of such variable SETs could practically be made to function. An SET circuit created of identical SET ASiMs by contrast, function without the need for tuning of each and every SET and would therefore be simpler and more cost effective to make and to operate.

ASiM SETs will also have the smallest possible capacitance and therefore the largest possible charging energy per electron on the central dot, making the SETs function readily at room or even more elevated temperatures. Highly energy efficient circuits composed of SETs can be built.

Consideration to the substrate needs to be given. Two close spaced ASiQDs on a single silicon dimer of the Si(100) surface interact more strongly than do 2 or more ASiQDs generally. The splitting resulting in that particular case creates states resonant with the bulk silicon valence and conduction bands. As a result, ASiMs containing two or ASiQDs on a single dimer will not have ASiM in the band gap. These ensembles will leak or be merged with bulk states.

This leakage can be deployed to purposely connect a ASiM with the bulk, so as to electrically connect the ASiM of example A single atom with gap states and with the capacity to be in the +1, 0, or −1 electronic charge states can be rendered incapable of holding a charge if coupled to another ASiQD on the same dimer on the Si(100) surface. This can be used to eliminate charge centres and pinning centres.

On the Si(111) surface, ASiQDs can never be closer than 3.84 Angstroms and as a result cannot achieve large enough splitting energies to create new electronic states resonant with the valence and conduction bands.

An inventive AsiQD has the attributes of: multiple dangling bonds (DB) on the otherwise H-terminated Si(100) surface, or the H—Si(111) surface or other H-terminated silicon surfaces can form quantum dots; a single DB is a quantum dot that can have three ionization states, it can +1, 0 or −1 charged, corresponding respectively to 0, 1, or 2 electrons in the DB state; and all the charge states are in the silicon bulk band gap. It is appreciated that while the present invention has been detailed with respect to H terminated surfaces silicon, the analogous inventive devices are formed above a surface of germanium and carbon. Other substrate materials suitable for the similar generation of such dangling bond states illustratively include semiconductor domains having incomplete surface passivation, specific forms of which include protonated surface, locally doped and nanocrystalline domains of semiconductors illustratively including silicon, a variety of extrinsic and intrinsic monoatomic, binary and ternary semiconductors illustratively including silicon, gallium arsenide, gallium phosphide, indium phosphide, germanium, indium arsenide, indium antimonide, gallium aluminum arsenide, cadmium sulfide, zinc sulfide, aluminum indium phosphide, aluminum gallium arsenide, aluminum indium arsenide, aluminum gallium antimonide, gallium indium phosphide, lead tin telluride, copper gallium selenide, zinc germanium arsenide, and copper iron sulfide, and advantageous crystallographic orientations of these.

The coupling of DB states occurs by placing multiple DBs together in close proximity form a larger quantum dot. The multiple silicon atom quantum dot, MSiAQD also has its states in the silicon band gap.

The states being in the gap is crucially important and unique. It allows for decoupling of bulk and ASiQD and MSiAQD electronic states. That in turn means electrons in such surface states are effectively electrically isolated from the bulk. And that isolation in turn means that MSiAQD entities do not require an electrically insulating layer between themselves and the bulk.

In making atom scale circuitry on a silicon substrate, it becomes necessary and desirable to provide ultrafine, even atom scale wiring to the active entities of the circuitry. The need for an insulator between such a wire and the silicon substrate enormously complicates, enlarges, and brings spatial and compositional uncertainty to the wires and their exact relation to the address active entities. As the present invention eliminates the need for an insulating layer, and the ability to make wires with reproducibly precisely, atomically defined character greatly enables and advances the act of making atomic level circuitry. Specifically, having known and unvarying relationships between electrical leads and the entities they address leads to near zero inhomogeneity in circuit properties.

Thus the present invention and these techniques are highly desirable in memory elements, classical circuitry of diverse type, and to a broad range of coherent quantum circuitry also.

The dots of the present invention are unique in that current does not flow through the devices.

Atomic Level Device Elements

A charge state transition is seen by recording the AFM signal while sweeping the bias between sample and AFM tip. This technique, known as Kelvin probe force microscopy, KPFM, has been widely applied to study the contact potential difference between probe and sample, and more recently, to detect discrete charge state transitions on single Gold atoms.

STM images clearly reveal the atomic structure of silicon dangling bond ensembles on H-terminated silicon. AFM images of the same area, collected such that the images are dominated by electrostatic forces, show the positions of the charges and therefore the logical state of the gate. These images are taken at a somewhat larger tip-sample separation distance than is used for atomically resolved imaging. Electrostatic forces have a longer tail than other forces that contribute to AFM imaging allowing us to record images that are to a good approximation maps of localized charge.

Tunnel coupled pair of DBs, collectively, have a charge of −1. As the tunneling interaction among DBs falls off exponentially, the somewhat further removed perturbing DB is not significantly tunnel coupled to the pair and acts instead as a fixed electron charge. Also, the perturbing DB is not Coulombically destabilized enough to lose its negative charge. Correspondingly, the KPFM transition energies for the perturbing DB and for the DB furthest from that atom, traces xx1 and xx2 in FIG. 9, are similar. The KPFM trace for the middle DB shows a distinctly shifted charge transition energy. This shift is due to the repulsive effect of the perturbing DB. Accordingly, a relatively positive voltage between probe and sample must be applied to record the negative to neutral charge state transition of this DB.

Expressed otherwise, the middle DB is seen at zero probe bias, but under the influence of the negative perturbing DB, is already in the neutral state. It is evident that the tunnel coupled DBs form a double well potential that can be polarized by an electric perturbation. In this example, the double well is tilted to the "left", causing the shared electron to tend to localize there.

A fixed charge, or a variable bias electrode, can localize charge to one side of a double well potential formed of two tunnel coupled DBs. Likewise, in more complex potential energy surfaces due to larger ensembles of atomic silicon quantum dots, an applied potential spatially shifts electrons. This allows information to be encoded in spatial charge distributions and for information to be transferred without the use of a conventional current, with minimal energy consumption per operation, and with no quiescent power consumption.

Figure 8A:
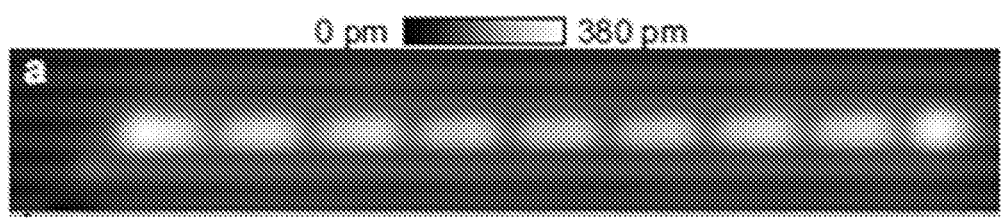
FIGS. 8A-8F show information transmission through atomic silicon quantum dot (ASiQD) constructed binary wire.
Figure 8B:
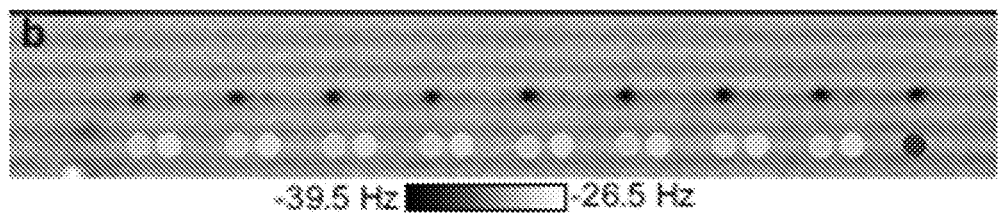
Figure 8C:
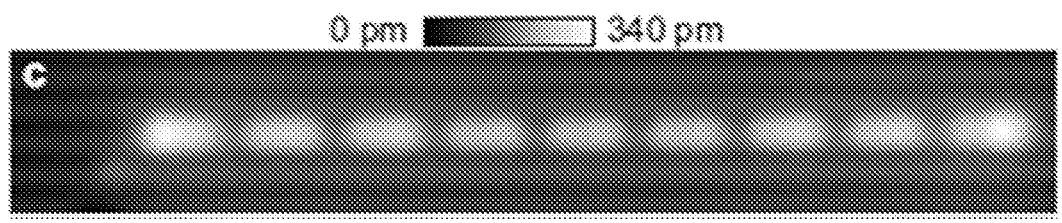
Figure 8D:
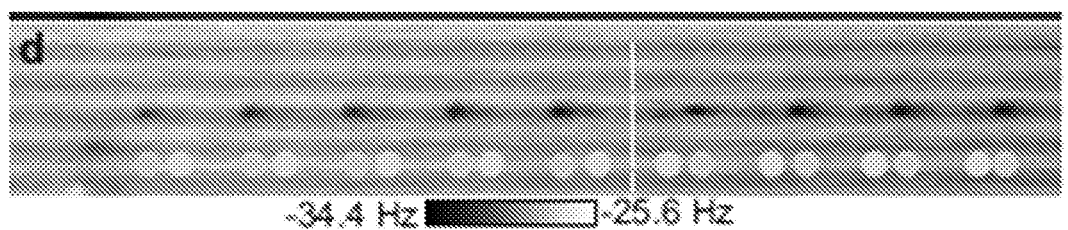
Figure 8E:
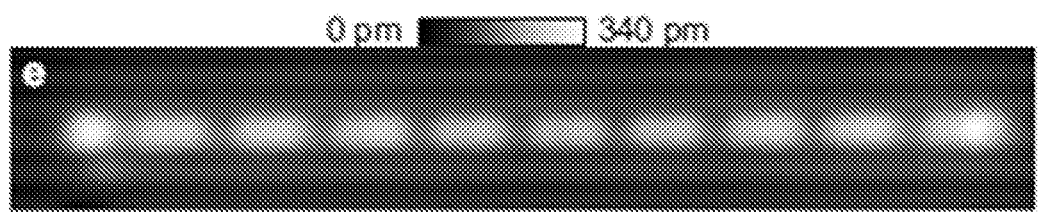
Figure 8F:
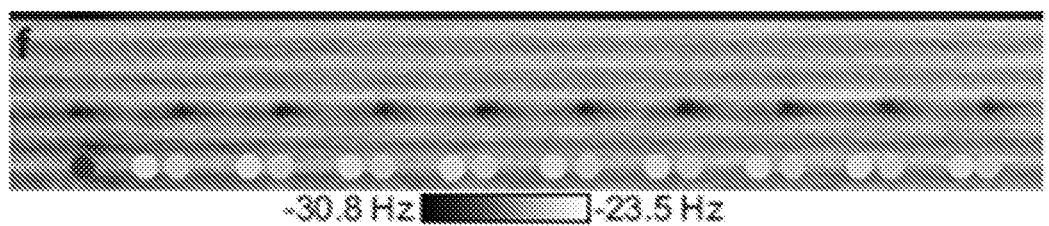

FIGS. 8A-8F show multiple DB pairs aligned end to end. As before, a single perturbing charge is applied at one end (right side) to induce all pairs to align in one of the two available polarized states, FIGS. 8A and 8B. In FIGS. 8E and 8F the same line of pairs is polarized from the other side. And correspondingly all the pairs polarise to the right. The initial polarising DB in FIGS. 8A and 8B was controllably capped with a single H atom, thereby entirely eliminating the gap state that automatically sequestered one electron there, and that served as an input per FIGS. 8C and 8D To demonstrate the two-state line could be polarised in the opposite sense, a new DB was created at the left side as shown in FIGS. 8E and 8F.

No reset operation of the line is needed. The two state line is instantly ready to function again. While not excluded from certain envisaged applications, in the present embodiment, the scanned probe instrument is not a component of the device, it is only an observing tool.

The number of atoms per cell may be varied. Additional variants include different intra and inter cell spacing and as well, through Fermi level adjustment different occupation levels allow for a great many avenues for tuning of properties. For the case shown here, it has been estimated that the tunnel rate (among two DBs in a pair, there is no significant tunneling between pairs) is approximately 10 fs. It can be seen that the imposed polarisation state is spread along the line, very roughly, at a time that is the product of the tunnel time and the number of cells. This propagation mode takes the place of an ordinary RC time constant, and, readily allows data transmission rates at THz clock rates.

The energy required to switch a cell is approximately the electrostatic energy required to place an input charge near a single electron occupied 2 Db cell; approximately 0.3 eV.

Figures 9A, 9B, 9C:
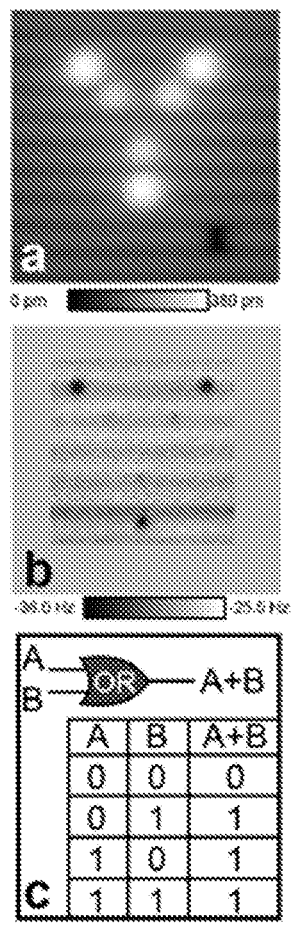
Figures 9D, 9E, 9F:
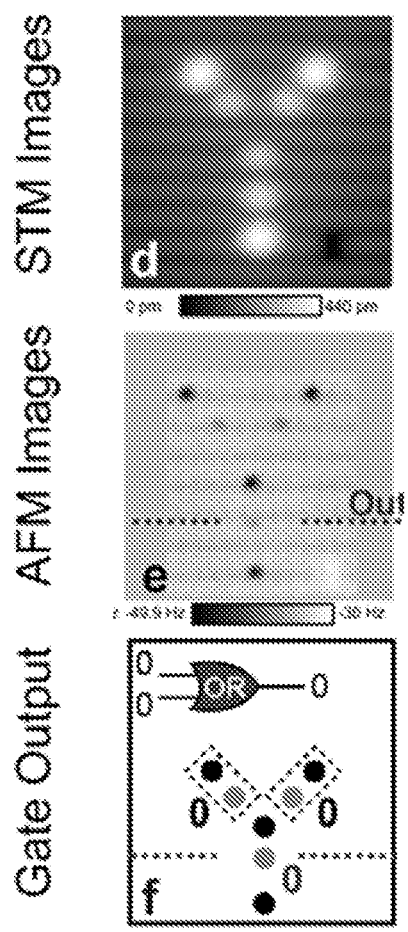
Figures 9G, 9H, 9I:
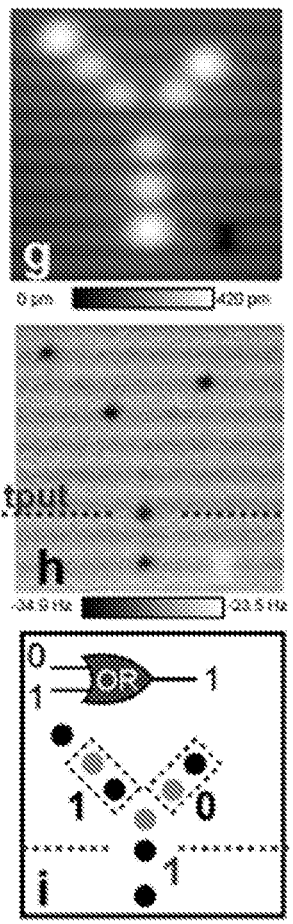
Figures 9J, 9K, 9L:
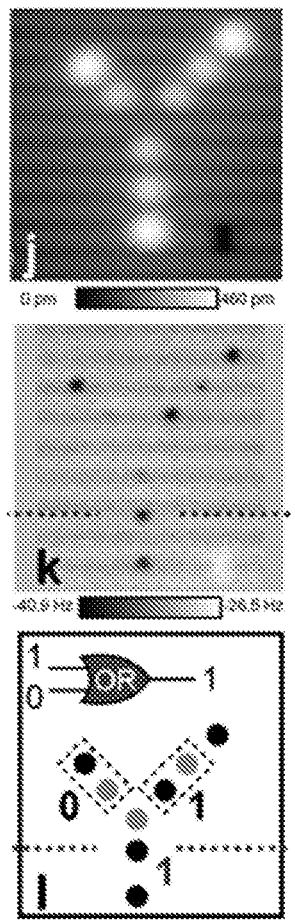
Figures 9M, 9N, 9O:
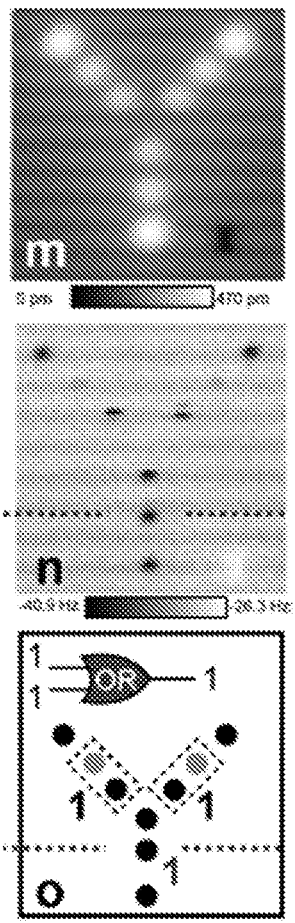

FIGS. 9A-9O shows a binary logical OR gate. The two top most branches are electrostatic inputs and the lower branch is an electrostatic output. All the states of the truth table, shown in FIG. 9C, are exhibited in FIGS. 9A-9D. At the terminus of the output branch is a single DB that serves as a "spring". Using highly n-type doped silicon, negative charges can be placed in the current structures but not positive charges. As a result, the device can electrostatically "push" but not "pull" on the charges controlled. In order to establish opposite polarisation states of DB pairs as the two binary states, a weak perturber is placed at the terminus of output branches. In the absence of a negative charge at the input, the line is polarised toward the input, creating what is labeled a binary state "0". When a negative input is in place, the two state line flips to a state "1". As the gate is naturally a negative charge repulsive character at the inputs, the spring function required for proper function of a connected output of a previous gate is assured.

Just as the binary wires require electrostatic inputs and provide electrostatic outputs, the gates all receive and output electrostatic states. In various embodiments, the binary wires can be combined with the binary logic gates. The binary wires convey binary inputs to the gates and convey binary outputs from the gates to subsequent gates or to other receptors of the binary information so computed. The function of the gates utilizes combined quantum mechanical and electrostatic physical interactions.

According to embodiments of the present invention, two or more ASQDs, in suitably close proximity, from 0.14 nm to several 10s of nm, enter into quantum mechanical associations that allow electrons to tunnel among the coupled ASiQDs. Electrostatic effects derive from the positive charge at the nuclei of the ASiQDs and from the electrons bound to or near to the ASiQDs. The electrostatic positions of electrons confined to double, or multiple, well potentials within the gate structure embodies the binary information. Information encoded in the form of electrostatic magnitude, and spatial arrangement, provides inputs to the gates. Upon receiving inputs, the electrostatic interactions within the gate spontaneously leads to spatial charge arrangements that provide a logical output consistent with the truth table for the particular gate. The time required for an output signal to exist after the arrival of input signals is a small multiple of the average tunneling time of electrons between ASiQDs. For the OR gate shown in FIG. 9, that time is $<10^{-13}$. Alternately, expressed as a rate, that is 10 THz, which is 10,000 GHz.

Static electrostatic inputs in the form of singly charged atoms are shown here to demonstrate function of the wires and gates. Analog wires which can be biased at any voltage within a range of several 10s of volts about the Fermi level and with a resolution of nanovolts or finer can also serve as inputs to the wires and gates.

The bit energy, which is the energy required to change from one binary state to the other is determined by the strength of quantum mechanical coupling among the ASiQDs and is equal to 0.3 electron Volts for maximally coupled ASQDs. More widely spaced ASiQDs can be deployed to achieve smaller coupling energies. This bit energy is larger than kBoltzmann T ensuring that the integrity of information embodied in this material system, for the duration required, is maintained.

According to various embodiments, the gates and the binary wires can be clocked, that is, the rate of passage of information through a logical operation can be regulated by a time varying control signal. In this AsiQD-based circuitry the clock signal provides gain. Gain is required to ensure signals are not degraded as sequential operations are performed. An output is obtained spontaneously upon presentation of inputs. Latch circuitry in coordination with the clock signal allows the output of one sub-circuit element to be retained so as to serve as the input of a subsequent circuit stage. In some inventive embodiments, inventive dots can be arranged to create fanout—that is, one input to a fanout device is copied to provide 2 or more outputs. This allows for outputs at any stage to be sg=hared with any number of following circuit elements.

The present invention provides very low power consuming circuitry. Because no transistors are employed in this circuitry and because no current is required to charge gates or other elements and furthermore because no current is sent to ground, extremely little power is required to actuate this circuitry. A fixed number of electrons stay within each circuit element. Electrons are merely spatially rearranged to represent information and to cause computation to occur. Latched inputs enforce information flow in the direction from inputs to gate outputs. Subsequent latching of outputs causes passage of information to the next circuit stage. According to various embodiments, asynchronous as well as synchronous and periodic clocking and latching can be employed.

The present invention provides many structural options for gates. The magnitude of spacing among ASiQDs and the angular direction affects coupling strength, type of interaction.

According to some embodiments, the present invention provides an electrostatic bias that compensates for our all-negative quantum dots. Because all points are zero charged or negative, charges can be pushed push but not pulled. Accordingly, placing a charge at a far end of circuit elements so allows pushing a charge so it naturally comes back to equilibrium under force of the bias.

The present invention also provides clocking, including both the regulation of information passage and maintenance of signal strength or gain, is achieved by local Fermi level adjustment. In various embodiments, an electrode near to a logical circuit block, consisting of multiple inputs, outputs and gates, raises or lowers the potential in the vicinity of the circuit block so as to change the electron occupation of ASiQDs. Either change blocks the passage of information along binary wires and through logic gates. By enforcing desired input values at the edge of the sub circuit while the Fermi level adjusting electrode is returned to its regular value corresponding to electron occupation that gives desired logic functions, the sub circuit reaches a ground state free of kinks and the correct output value is established. The settling time of the output is of the order $10^{-13}$ seconds.

The present invention also provides positive and negative charge based circuitry. At different doping levels or at different electrostatically set Fermi levels, the circuits are made from zero charge rather than negative charge quantum dots. This provides for binary but also analog and quantum circuitry. Elements as used here for classical computing together with other ensembles can be made from the inventive quantum circuitry elements.

According to embodiments of the present invention the quantum dots are encapsulated. That is, the inventive quantum dots are in permanent vacuum encapsulation. DBs not immediately adjacent to another DB are generally unreactive toward common gaseous molecules including N2, O2 and many hydrocarbons.

According to embodiment of the present invention, a line of tunnel coupled ASiQDs with multiple perpendicular analog or binary wires forms a shift register. The register can be of arbitrary length. Similarly, a ring Oscillator is provided. A cyclic sequence of inverters forms the ring oscillator. A flash analog to digital converter and a digital to analog converter can also be made. Resonant structures capable of interacting with external or locally provided electromagnetic fields (for signal input/output or signal processing/transduction) are similarly enabled.

Using the present invention, many forms of A/D can be made. Of particular interest is a flash A/D drawing low power. The present invention also provides for a frequency divider. That is, a multi stage binary frequency divider for radio telephony front end with input frequencies up to 10 THz.

The present invention is further detailed with respect to the following non-limited experimental examples.

Experiment Set-Up

DBs are created controllably with the probe of a scanned probe microscope. A voltage and or current larger than is used for imaging is applied briefly to the H atom to be removed. Current rises when an H atom is removed. Upon checking for that change and finding H removal, the electrical conditioned applied to break the specific targeted Si—H bond is ceased. Re-imaging reveals the newly created DB. Patterns are created by placing the tip over desired positions and removing multiple H atoms thereby creating multiple DBs.

A lock-in amplifier collected the dI/dV signal at each point. Thus, the local density of states, LDOS, of the DB chain as a function of voltage (usually from −0.4V to −1.8V) have been mapped out. The experimental technique is not sensitive to z-drift (tip sample separation) as the tip height is reset each time a line or map is completed. The z-drift is estimated in the time taken to move along a line or scan over a map, a maximum of 3 minutes, is negligible.

Experiments were conducted in an Omicron Low Temperature STM at 4.5K under ultra-high vacuum (UHV). A lock-in amplifier was used to measure dI/dV signal (modulation frequency of 760-820 Hz and amplitude of 30 mV).

Arsenic doped (0.002-0.003 mOhm/cm) Si (100) samples were direct current heated to 1050 C for a short time for oxide desorption, and hydrogen terminated at 330 C for ~20 s under hydrogen exposure, forming the H—Si(100) 2×1 surface. It is known that flashing to 1050° C. does not significantly remove dopants in the near-surface regime and so a uniform dopant profile persists all the way to the surface.

Polycrystalline electrochemically etched tungsten tips were heated to ~800 C for about two minutes under UHV condition for cleaning and oxide desorption. Their quality was checked by field ion microscope (FIM), and nitrogen etched to obtain single atom tips. Small tip modifications were made during STM measurements by slightly contacting the tip with a patch of bare Si while applying a voltage of −2 to −3V.

An algorithm has been developed to facilitate atomically precise DB patterning. The tip was placed over the desired location and a train of voltage pulses was applied to desorb hydrogen. Successful hydrogen desorption was checked by comparing the current set-point before and after applying each pulse. The voltage magnitude for each pulse was increased in small increments until a desorption was detected. In this way, two to seven long DB chains were patterned along and on the same side of a dimer row in the closest spaced arrangement allowed by the lattice (0.35 nm).

Example 1

FIG. 1 shows various characterisations of a linear 3 DB MSiAQD formed along one side of a dimer row on the Si(100) H terminated surface.

The large dI/dV vs position graphic conveys much information about the energy and spatial distribution of local state density. In other words, it shows where electrons are localized, and not, at each energy probed.

At most energies, strikingly, little state density is observed at the central atom position. This is a great and clear departure from the single ASiQD result. It clearly shows the emergent molecule like spectroscopy of the ensemble resulting from quantum mechanical overlap of atomic like orbitals.

Close space DBs form substantial electron sharing bonds. The newly emergent electronic structure is observed in multiple modes of imaging with a scanning tunneling microscope (STM). Spatially point specific dI/dV spectra show pronounced changes indicating new electronic structure. Whole 2D images of dI/dV, taken at a specific V show local density of states variations at that energy across the area of the new multiple silicon atom quantum dot. This is a new artificial molecule with tailored density of states to allow an externally applied (vertical) electrostatic field (i.e. Fermi-level tuneable) to alter the lateral 2D charge multipole distribution. As a result, an artificial 2D molecule according to the present invention operates akin to a field transducer to allow the external vertical field (by varying total charge and/or spatial occupation of charge) to have unprecedented Angstrom scale control of lateral field shape/sharpness/direction on the surface.

dI/dV spectra over a range of voltages, taken along a line from one end of a molecule to the other, reveal a whole spectral map of the molecule's density of states.

Clearly emergent structures in LDOS are noted as DBs are brought close together (and wavefunctions overlap). This is proof of mixing of DB wavefunctions and the formation of collective states or what can equally be called molecular states.

Further to the 3 DB Chain in FIG. 1. FIG. 1(a, b) shows STM constant current images collected at −1.8V and 1.4V respectively. The setpoint current was 50 pA. In Filled states, the 3 DB chain appears as two bright spots. In empty states, the 3 DB Chain appears as one bright spot spread over the length of the chain. FIG. 1(c-e) show constant height dI/dV maps taken of the 3 DB chain at three different bias voltages: −0.9V, −1.05V, and −1.7V. Note that the color scale for the three dI/dV maps is different for each map. FIG. 1(f) shows a plot of dI/dV linescans along the axis of the 3 DB chain, shown in a dotted line in (a), from −0.4V to −1.9V with 10 mV resolution. For (c-f), the tip height was set at −1.8V 20 pA over an H—Si dimer near the chain with 60 pm tip retraction after the feedback loop was turned off. We observe a change of the patterns in dI/dV maps and linescans as the voltage is increased. We identify three regions where the dI/dV patterns take on different character for this 3 DB Chain: From −0.6V to −1.0V they take on the appearance of two bright spots. From −1.0V to −1.2V they take on the appearance of two dark spots in the same spatial location. We observe negative differential resistance within the spots, with two bright rings that surround the spots. Finally, From −1.2V to −1.9V we observe two bright spots once again.

Figure 2:
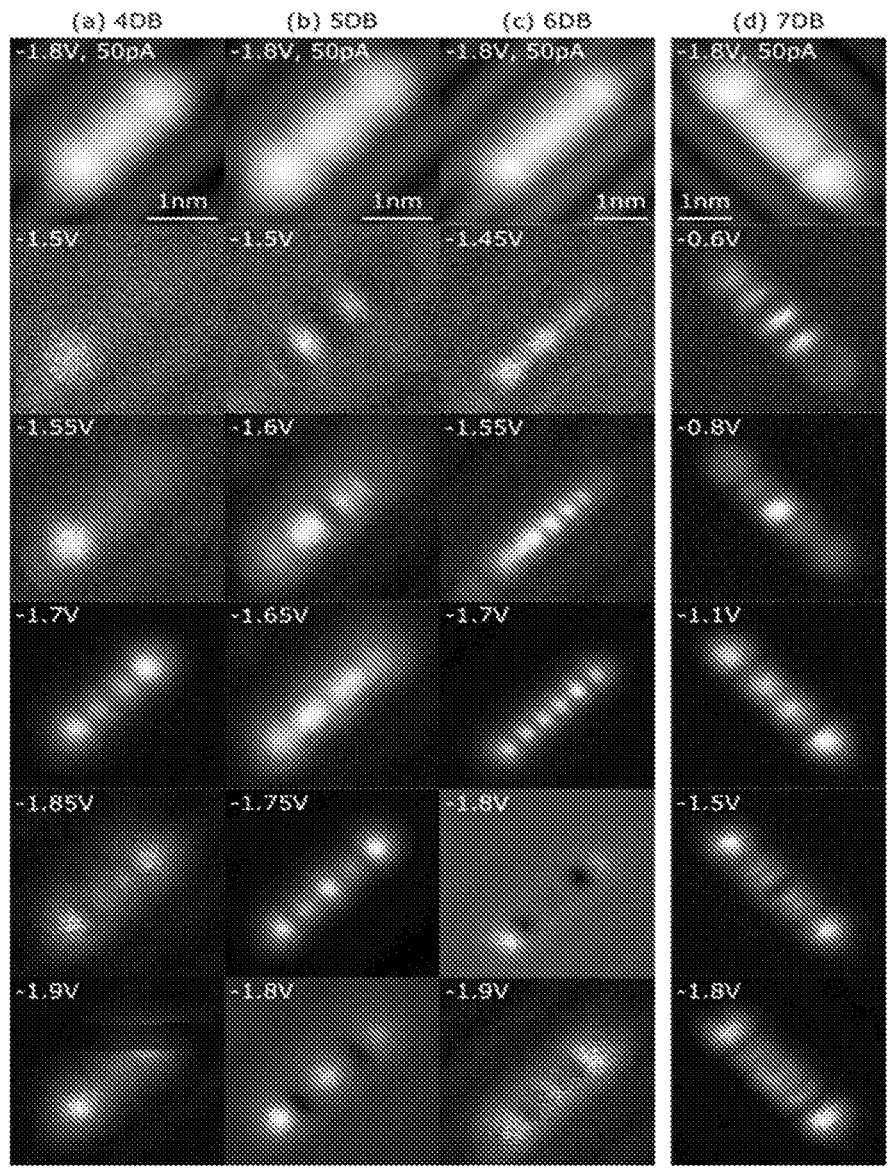
FIG. 2 shows a DB Chains of greater length. (a) 4 DB Chain, (b) 5 DB Chain, (c) 6 DB Chain, (d) 7 DB Chain. The 5 DB (b) and 6 DB (c) Chains were formed by adding DBs to the upper right end of the 4 DB chain (a). The first image of each column is an STM constant current image at −1.8V, 50 pA. All other images are dI/dV maps taken at a tip height of −1.8V, 20 pA with a 60 pm tip retraction over an H—Si region. The sample bias during collection of each dI/dV map is labelled in the upper left corner of the map. The scale bar for both the STM image and the dI/dV maps for each column is shown at the bottom of each column's STM image.

FIG. 2 shows similar results for a variety of other chain lengths. In all cases there are no Si—H entities in between the DBs. Rather, the DBs are as close together as the silicon lattice allows, 3.84 Angstroms.

When H atoms intervene between DBs, as is the case in all but one previous published example, the strong mixing and bind of atomic states does not occur and the qualities describe here are not observed. When intervening H atoms exist between DBs the images of such widely spaced ensembles reveal only a simple sum of the qualities of the constituent parts—not—as seen here—newly emergent properties that ire non-linearly related to the properties of the parts.

In FIG. 2 it is seen that diverse electronic properties are observed as a function of number of constituent atoms, as well as of functions of energy and position.

In the dI/dV maps of DB chains of length 4, 5, 6, and 7 in FIG. 2 each column corresponds to one DB Chain length. The first image of each column is an STM constant current image of that chain, imaged at −1.8 V with a setpoint current of 50 pA. The remaining images are dI/dV maps of that chain taken at a tip height of −1.8V, 20 pA with a tip retraction of 60 pm over a H—Si dimer. All chains the patterns in dI/dV maps are noted to change as a function of sample bias. The bright spots often do not correspond to the locations of the DBs. Thus the patterns must be emergent from an interaction between the DBs that make up the chain. Most STM images and dI/dV maps are symmetric about the center of the DB chain. The 5 and 6 DB chains in (b,c) were made by extending the 4 DB chain in (a). Knowing this, we note that similar features appear at similar voltages for the 4, 5, and 6 DB chains shown: At a sample bias between −1.7V to −1.75V, the dI/dV maps show the same number of bright spots as the number of DBs in the chain. For the 5 and 6 DB chain at a sample bias of −1.8V, the dI/dV maps appear to show spots with negative differential resistance.

Figure 3:
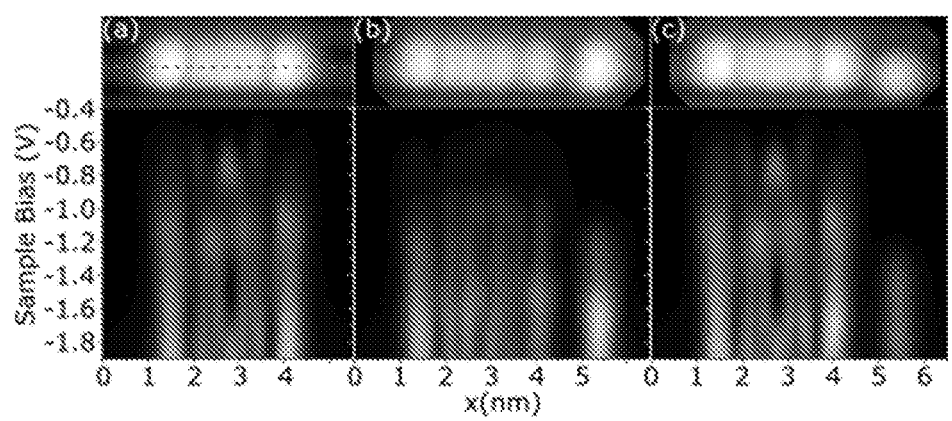
FIG. 3 shows a controlled perturbation of a 7 DB chain (a) with a single DB (b) and with a bare dimer (c). The top images in (a-c) are STM constant current images taken at −1.8V with a current setpoint of 50 pA. The bottom images are dI/dV linescans of the 7 DB chain and the perturbing feature along the central axis of the 7 DB chain, shown in the dotted line overlaid on the STM image in (a). The height setpoint of the dI/dV linescans was −1.8V, 20 pA with a tip retraction of 60 pm over a H—Si dimer. The x scale of each dI/dV linescan is lined up with the x scale of each STM image. The perturbing single DB in (b) is located on the same side of the dimer row as the 7 DB chain, with one intervening H—Si dimer between the DB and the 7 DB chain. The perturbing bare dimer in (c) was made by removing the DB on the same dimer as the original perturbing DB in (b). In all dI/dV linescans, the state density associated with the 7 DB chain is found at an x position of 1 nm to 4.5 nm. In the dI/dV linescans of (b) and (c), the the state density of the single DB and the bare dimer respectively are found at an x position of ~5.5 nm.

FIG. 3 is different qualitatively from above results, not only in that it is a seven atom chain, but because the electronic perturbation of that chain is also demonstrated.

FIG. 3 shows the perturbation effect of a localized charge on a 7 DB chain. The STM image and the dI/dV linescan of the unperturbed chain (FIG. 3(a)) exhibit emergent patterns. The patterns are symmetric about the center of the DB chain. A significant dI/dV signal begins at a sample bias of about −0.6V.

In FIG. 3(b), we see the same 7 DB chain perturbed by a single DB on the same side of the dimer row with one intervening H—Si dimer. The STM image shows higher topography on the end of the chain furthest from the DB and the overall pattern is changed compared to the unperturbed 7 DB chain. The dI/dV linescans show higher state density on the end of the chain farthest from the single DB. They show patterns very different from that of the unperturbed 7 DB chain. Although a faint dI/dV signal is seen from −0.6V to −0.9V, it is substantially less than the magnitude of the signal seen at the same voltages on the unperturbed 7 DB chain.

These observations show that by placing a DB, or a localized charge, next to the 7 DB chain, we electrostatically influence the chain and cause its electron state density to shift away from the perturbing localized charge. The localized charge also increases the energy of all electrons on the chain, causing a great reduction of state density at lower voltages, −0.6V to −0.9V, compared with the unperturbed 7 DB chain.

A single DB naturally attains a negative charge on a highly doped substrate as is used here. It is that localised charge that is electrostatically altering the properties of the adjacent MSiAQD.

Surprisingly, creating another DB immediately adjacent to the first perturbing DB, specifically on the same underlying si dimer, reduces the negative charge localised in the vicinity. This reduction in charge localisation occurs because the strongly interacting nature of 2 DBs on one dimer causes a large energetic splitting. So much so that the new symmetric and antisymmetric states created—often referred to as pi and pi star states, are resonant respectively with the bulk silicon valence and conduction bend edges. As a result the electrons do not localise but are rather disbursed in those bands.

Upon replacing the single perturbing DB with 2 DBs of a bare Si dimer it is evident that the STM images and dI/dV linescans of the 7 DB chain hae returned to the unperturbed state.

In addition to showing the reversibility of the electronic perturbation effect on the MSiAQD, this effect demonstrates that utility of a clean dimer as a way to connect gap states such as those we create with ASiQDs and ensembles thereof to bulk states. One wire of multiple wires required to connect and operate a atom scale structure could be provided by the bulk, thereby greatly reducing the number of wires required, and reducing complexity, and increasing circuit density and simplicity.

Figure 4:
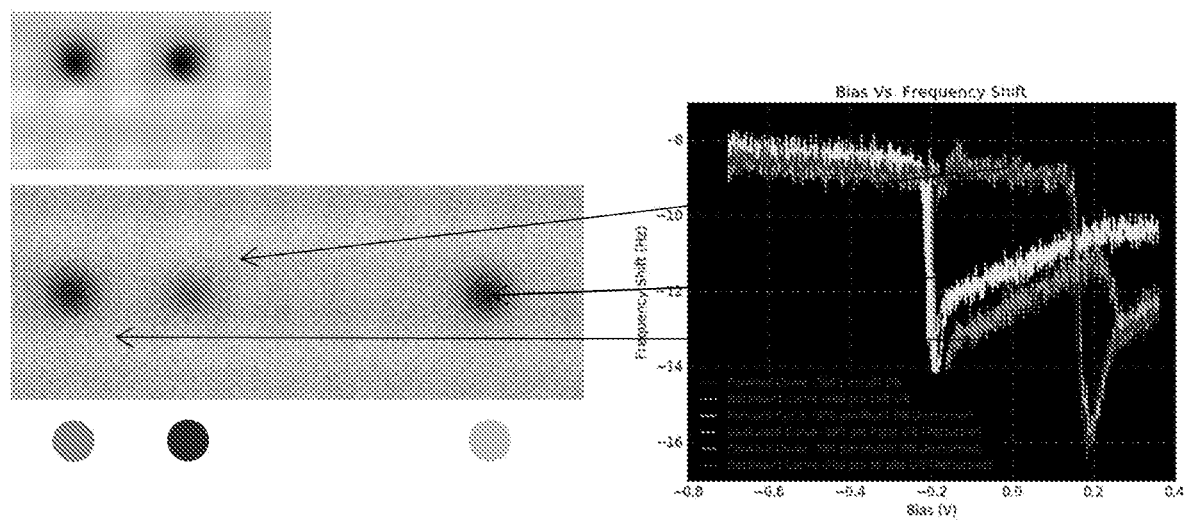
FIG. 4 shows a graph. The graph at the right of FIG. 4 shows colour coded curves of change in atomic force microscopy oscillation frequency as a function of applied voltage between probe and sample. The pronounced transitions represent the charge state transition of the particular DB beneath the probe. The normally transition of ~0.2 is greatly shifted for the most perturbed DB and in a sense consistent with the negative charged perturbation.

An end to end arrangement of paired DBs can also form an effective wire. In FIG. 4 shows 2 DBs, separated by one Si—H unit on the H—Si(100) surface. This pair is a charge qubit. The lower part of the figure shows that same pair of DBs being perturbed by a third, negatively charged DB. Polarization of the pair is evident. As dark shading in these charge sensing atomic force microscopy images corresponds to negative charge, we see that the DB closest to the perturber is rendered relatively less negative.

Figure 5:
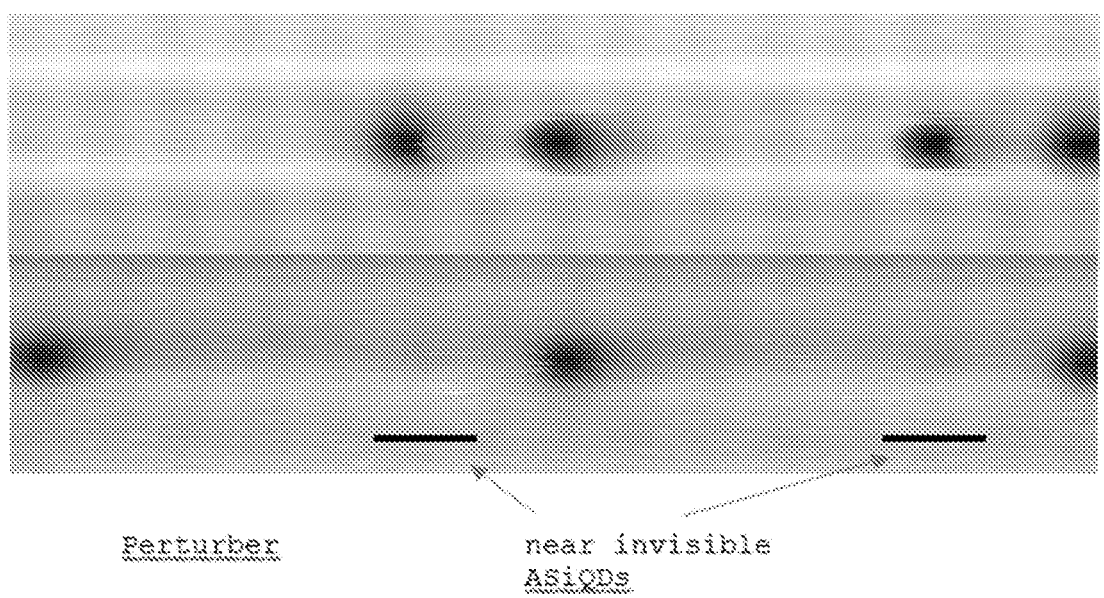
FIG. 5 shows an elaboration of FIG. 4 depicting two qubits. When the same perturbation of FIG. 4 are applied— the same result was achieved in the nearest qubit. Remarkably, in addition, it is observed that the qubit directly biased by the perturber has in turn biased the second qubit. Note the most perturbed DBs are still present but rendered here almost invisible. These electronic changes are entirely reversible.

In FIG. 5, an elaboration of FIG. 4—an extremely important elaboration is shown—of the effect show above. Here, two qubits are formed. When the same perturbation as per FIG. 4 was applied—the same result was achieved in the nearest qubit. Remarkably, in addition, it is noted that the qubit directly biased by the perturber has in turn biased the second qubit. Note the most perturbed DBs are still present but rendered here almost invisible. These electronic changes are entirely reversible.

These results show a degree of single atom and single electron charge control that have never before been demonstrated. The ability to harness and deploy this to achieve controlled interaction within a cluster of entities is clearly demonstrated also. That the control is manifest on silicon, and using the entities we desire is of diverse utility.

Example 2

This experiment shows the ability to form more complex and advanced atom scale electronic structures from multiple ASiQDs according to further embodiments of the present invention. Such structures have utility in binary computation or atomic binary logic.

FIG. 6A shows a constant current STM image of an ASiQD created by tip-induced desorption of a single hydrogen atom from the H—Si(100) surface. At relatively high voltages (e.g. −1.7 V), the negatively charged ASiQD appears in filled states images as a bright protrusion surrounded by a characteristic small dark halo (17). In the corresponding frequency shift map at 0 V (FIG. 6D)), hydrogen atoms decorating underneath silicon atoms appear as bright protrusions arranged in the 2×1 surface reconstruction. The ASiQD shows up as a dark feature indicating a much higher tip-sample attractive interaction (19).

FIG. 6C shows I(V) spectroscopy curves taken above the ASiQD and H—Si surface, with both the surface and ASiQD showing a zero current bandgap from around −0.8 to +0.2 V. FIG. 6D shows the Δf (V) spectra, i.e. KPFM spectroscopy, measured above the ASiQD with a bias sweep range of −0.6 to 0 V, a range in the bandgap of the material where no STM information would be available.

Interestingly, a sharp step is seen at around −250 mV. Prior work examining charged species (6, 21), electron transfer between molecules (7), and charge state changes in quantum dots (25) in NC-AFM experiments has shown this type of step feature to correspond to a dynamic single-electron charge state change. Therefore, based on previous works, the step seen in FIG. 6D can be assigned to the charge state transition of the ASiQD from negative (doubly occupied) to neutral (singly occupied) charge state, respectively right and left of the step in the Δf (V) curve around −250 mV.

When 2 ASiQDs are closely spaced, within about 1 nm or less, Coulombic repulsion causes one of the pair's extra electrons to delocalize in the conduction band (14, 22). That loss of an electron creates an unoccupied state in the pair of ASiQDs. That, and the low (0.5 eV) and narrow barrier between the atoms makes tunneling between the paired ASiQDs possible. FIGS. 7A-7I explores polarization of one of these tunnel coupled pairs of ASiQDs.

Figure 7A:
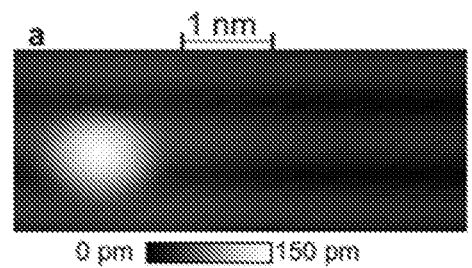
FIGS. 7A-7I show the polarization effect on a multiple Atomic Silicon Quantum dots structure. STM images (−1.8 V and 50 pA), frequency shift maps (zrel=−380 p.m and Amp=100 p.m) and frequency shift versus bias spectra (Δf (V)) for a single ASiQD (FIGS. 7A-7C), 2 tunnel coupled ASiQDs (FIGS. 7D-7F), and a 2+1 structure (FIGS. 7G-7I). The Δf (V) spectra are color-coded according to the arrows in AFM images.
Figure 7B:
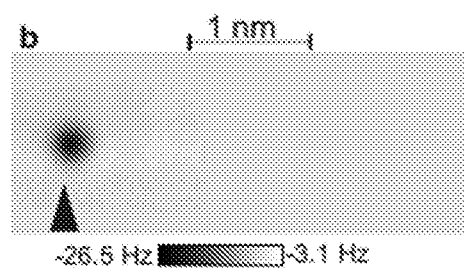
Figure 7C:
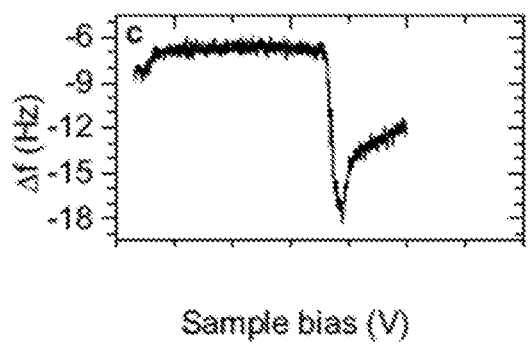
Figure 7D:
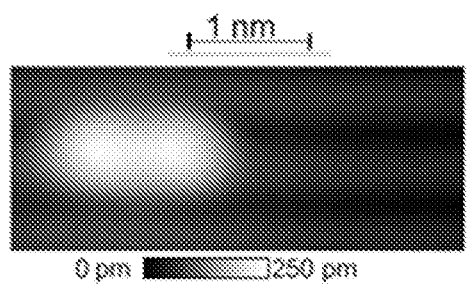
Figure 7E:
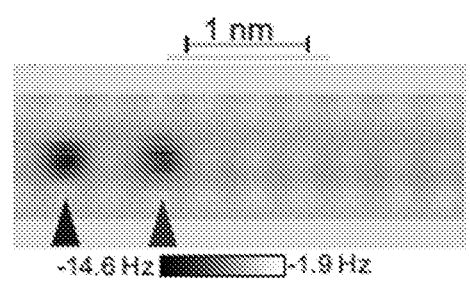

FIGS. 7A and 7B show an STM image of an isolated ASiQD and the corresponding frequency shift map. The Δf (V) spectra (FIG. 7C) shows a charge transition step at −0.2 V, Additional ASiQDs are added, but with care to ensure no tip changes with the addition of ASiQDs, and with identical parameters for AFM and KPFM. In FIG. 7D a second ASiQD is created that is tunnel coupled to the first ASiQD from FIG. 7B. The AFM image in FIG. 7E shows 1 intervening hydrogen atom between the pair, with a similar contrast observed above both ASiQDs. The KPFM measurement in FIG. 7H corroborates this, showing nearly identical AFM curves taken over the 2 ASiQDs, with the charge transition step shifted to a less negative value occurring now around −0.25 V. The tunnel coupled pair of ASiQDs, collectively, have a charge of −1, which accounts for this horizontal shift.

Figure 7F:
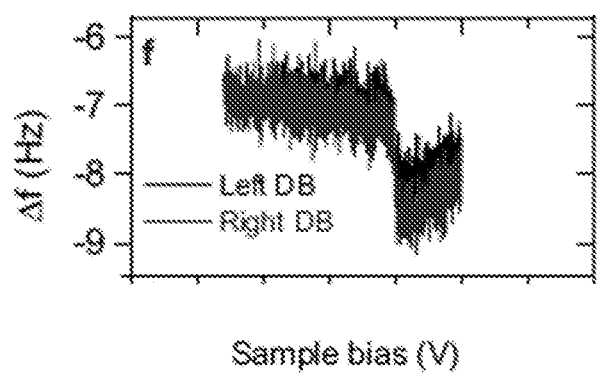
Figure 7G:
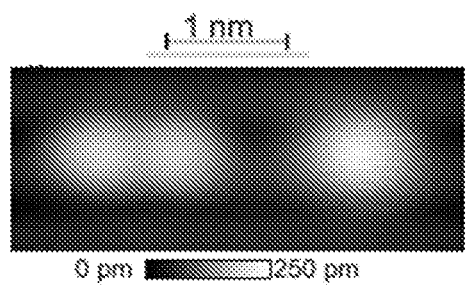
Figure 7H:
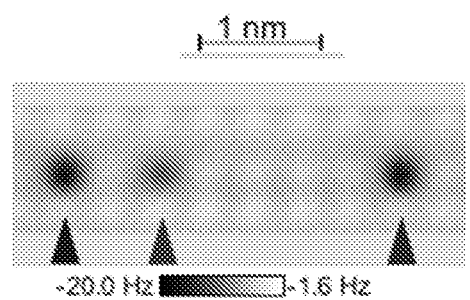
Figure 7I:
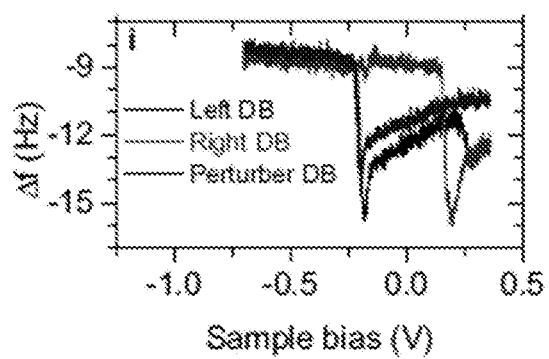

A 3rd ASiQD is added in FIG. 7G, with the AFM image in FIG. 7F showing a 4 H atom separation. This perturbing ASiQD is not significantly tunnel coupled to the pair as the tunneling interaction falls off exponentially, nor Coulombically destabilized enough to lose its negative charge. A stark contrast is noticed in tunnel coupled pair. The middle ASiQD is significantly lighter than the farthest ASiQD. Delving deeper and looking at the KPFM curves for this "2+1" experiment in FIG. 7I (a color coded inset is in the bottom left of FIG. 7I), it is noticed that the KPFM transition energies for the perturbing ASiQD (black) and for the ASiQD furthest left(blue) are markedly more negative than the middle ASiQD (red). The KPFM trace for the middle ASiQD shows a distinctly shifted charge transition energy to +200 mV. This shift is due to the repulsive effect of the perturbing ASiQD. A less negative voltage between probe and sample must be applied to record the negative to neutral charge state transition of this ASiQD. Expressed otherwise, it can be seen that the middle ASiQD at zero probe bias, but under the influence of the negative perturbing ASiQD, is already in the neutral state. It is evident that the tunnel coupled ASiQDs form a double well potential that can be polarized by an electric perturbation. In this example, the double well is tilted to the left causing the shared electron to tend to localize there.

Accordingly, the present invention proves a fixed charge, or a variable bias electrode, that can localize charge to one side of a double well potential formed of two tunnel coupled ASiQDs. This allows information to be encoded in spatial charge distributions and for information to be transferred without the use of a conventional current, with minimal energy consumption per operation, and with no quiescent power consumption.

Expanding on this principal, FIGS. 8A-8F and 9A-9O show multiple DB pairs aligned end to end, creating atomic binary wires and atomic binary gates. STM images shown in these figures reveal the position of atoms. On the other hand, AFM images in certain height regimes show the position of charges in the structure, and therefore reveal the logical state of the atomic wires or gates. Notably, the AFM images were taken at larger tip-sample separations where electrostatic forces are dominant in order to visualize the transmission of information easier. Therefore, they do not resolve the surface structures as seen in Reference (26) and FIGS. 6 and 7.

FIGS. 8A-8F show a STM filled states image of a fabricated 17, 18 and 19 ASiQD atomic binary wires. Colored circles underneath each structure are added for clarity to show the position of negative (blue), neutral (light green) and perturber (red) ASiQDs. FIGS. 8A-8F show an atomic binary wire consisting of 8 coupled pairs and a lone un-coupled DB acting as a perturber on the far right. DBs in a pair have a single H atom separation, and pairs are 4 H atoms from each other. Below the STM image in FIG. 8A is a constant height AFM image of the structure in FIG. 8B. As before, the far right single perturbing charge breaks the symmetry and induces all pairs to align in one of the two available polarized states (tipping left). FIG. 8C shows a STM image of the re-symmetrization of the wire, with the far right DB now turned into a coupled pair. The wire reacts by dividing down the middle in the frequency shift map of FIG. 8D with half falling left, and half falling right. The symmetry plane is marked with a dashed white vertical line in the AFM image. Finally, in FIGS. 8E and 8F, the same line of pairs is polarized from the opposite side with a 19th DB added on the left. The wire responds by assuming the other remaining polarization state (tipping right), reversing what was shown in FIG. 8A.

Accordingly, the present invention demonstrates a reversible information transfer expending only the entropic energy associated with rearranging electrons in coupled wells, while also showing no reset of the line is needed. The two state line is instantly ready to function again. The scanned probe instrument is not a component of the device, it is only an observer.

FIGS. 9A-9O show a binary logical OR gate according to the present invention. The two topmost branches are inputs, and the lower branch an output. FIG. 9A shows the "central" structure comprising the gate: 3 tunnel coupled pairs arranged at sharp angles and meeting in the center. Isolated from any electrostatic influence, the 2D assembly experiences electrostatic repulsion among the pairs, with electrons localizing to the outside of the branches as indicated by the contrast in the AFM frequency shift map in FIG. 9B.

In order to establish an opposite polarization state of the output ASiQD, an adaption is made and a weak perturber at the terminus of the lower output branch is used as demonstrated in FIG. 9D. This perturber acts as a "weak spring", polarizing the bottommost ASiQD from the central structure to be neutral, which is defined as the 0 state. This is shown experimentally in FIG. 9E and graphically in FIG. 9F. The first row of the truth table is established with two 0 inputs giving a 0 output.

When a negative input is in place at either the top left FIG. 9G, top right FIG. 9J, or both FIG. 9M input branches, the weak spring is overcome at the output with electrons in the structure rearranging accordingly and flipping the 0 state of the output to a 1 state as seen in the AFM maps FIG. 9H, FIG. 9K, and FIG. 9N respectively. Correlating this to the gate output models FIGS. 9I, 9L, and 9O, this fulfills the rest of the truth table. To complete the truth table, FIG. 9J is achieved by passivating the ASiQD input on the left in FIG. 9G using mechanical passivation, and creating the new input on the right.

Spectra of local force as a function of applied voltage reveal charge state transitions of single dangling bonds and of ensembles. Single electron induced switching of a double dot entity, and of a long sequence of double dots, from Left to Right or binary 0 and 1 states has been shown. A binary OR gate including all states of its truth table have been shown. It is also contemplated that extension of signals well beyond the gate output as well as NOT and AND functions among others.

Because the gates and the binary wires between gates require only single electron-level electrostatic actuation and because no conventional current is required, power consumption is extremely low. As the tunnel rate among coupled atomic quantum dots is of the order of femtoseconds (NJP paper on qubits 2010) signal transmission and gating action will be fast. THz operation rates are anticipated. The approach described here may enable a beyond Moore technology combining as it does enormous speed with ultra low power consumption while eliminating transistors.

Experiment 3—Process of Creating an ASiQD

Inventive ASiQDs are formed using an inventive process in which vertical manipulation of a single H atom using the tip of an AFM sensor and its application in characterizing and engineering silicon DB-based structures of relevance to nanoelectronic devices. Following a localized tip induced excitation on the Si—H surface, a single hydrogen atom is desorbed and may be either deposited on the surface with stable imaging in STM and AFM, or transferred to the tip apex. The single H atom functionalized tip is identified through a unique signature in frequency shift vs. displacement curves (i.e. $\Delta f(z)$) and a characteristic enhancement of STM images in filled and empty states. By bringing the H-functionalized tip apex very close to a DB in the absence of bias and current, a covalent bond between the single hydrogen and silicon atoms is formed. Subsequent changes in the STM images and $\Delta f(z)$ curves confirm that this mechanically induced reaction results in the passivation of the DB with the hydrogen from the tip apex.

CO functionalized tips are effective for characterization of adsorbed molecules on metal surfaces.(24, 28) The present inventive process provides embodiments of a process for preparing and identifying accessible and effective H functionalized tips, which allow characterization and also induce changes in DB-based structures on the H—Si(100) surface through selective mechanically induced hydrogen passivation, or "capping." Deuterium capped tips can be made similarily. Deuterium capping of ASiQDs can be achieved with such tips.

Figure 10A:
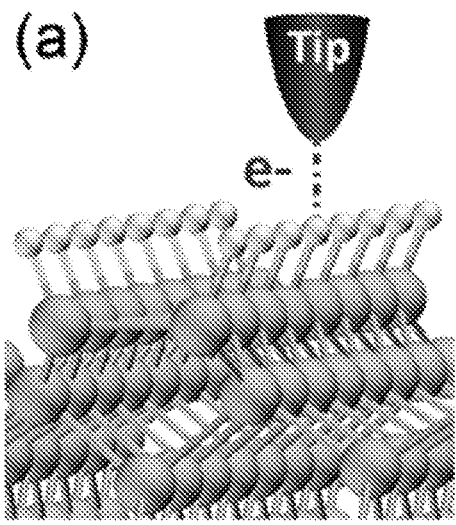
FIGS. 10A-10D show illustrations of the tip induced manipulation that can result in tip functionalization with a single hydrogen atom.
Figure 10B:
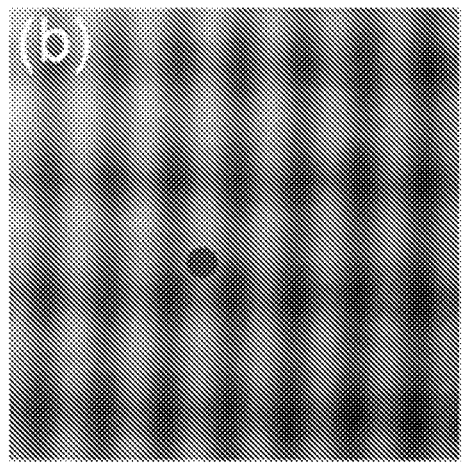

In the Si(100)–2×1 reconstruction, silicon atoms at the surface are organized in dimers. When the surface is passivated with hydrogen in the monohydride reconstruction, each silicon atom at the surface is covalently bonded with a single hydrogen atom as represented in FIG. 10A. FIG. 10B shows a typical defect-free empty states STM image acquired using a non-functionalized tip (see methods and ref (29) for details on in situ tip preparation).

Figure 10C:
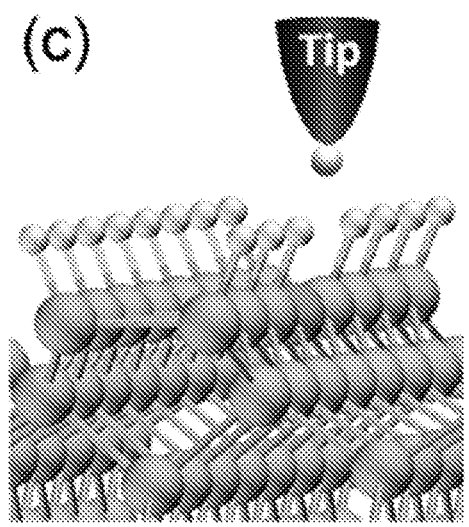
Figure 10D:
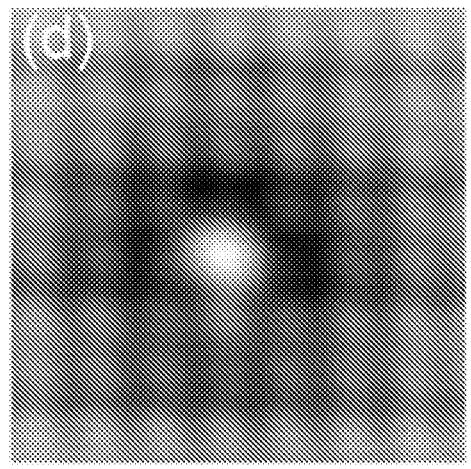

FIG. 10C shows a 3D ball and stick model of a silicon dangling bond (represented in green) on the H—Si(100) surface. To create a single DB, the STM tip is positioned on top of a hydrogen atom (red dot in FIG. 10B), then the feedback loop is switched off, and a voltage pulse of about 2.3 V is applied for a few milliseconds. As illustrated in FIG. 10C, this results in the selective desorption of the hydrogen atom under the tip apex which is often transferred to the tip. FIG. 10D shows a typical STM image of the created single DB. In accordance with earlier studies in the literature, the DB in empty states appears as a bright protrusion surrounded by a characteristic dark halo. (11, 14).

Figure 11A:
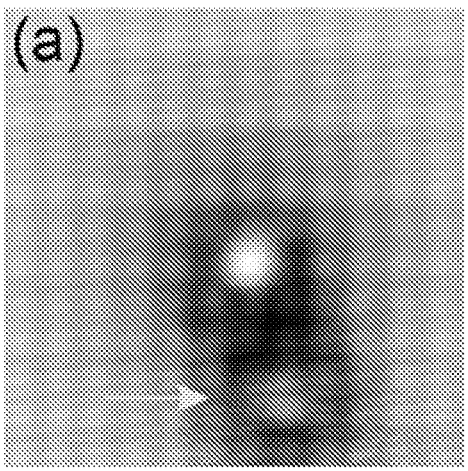
FIGS. 11A-11D show imaging of a single hydrogen atom physisorbed on the HSi(100) surface.

According to embodiments of the inventive process, the desorbed H atom is transferred to the tip apex roughly 50% of the times, i.e. forming a H-functionalized tip. In 30% of cases, the desorbed H atom is found on the H—Si surface close to the just created DB, as shown in FIG. 11A. In the remaining 20% of cases, the tip apex does not change and a hydrogen atom could not be seen in the vicinity of the newly created DB, suggesting it was possibly adsorbed on the tip away from the apex atom, deposited on the surface farther from the DB, or ejected to the vacuum.

Figure 11B:
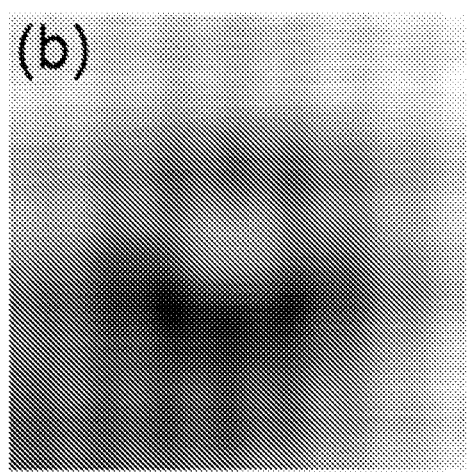
Figure 11C:
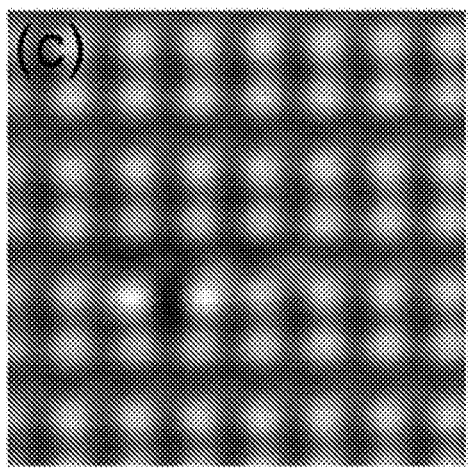
Figure 11D:
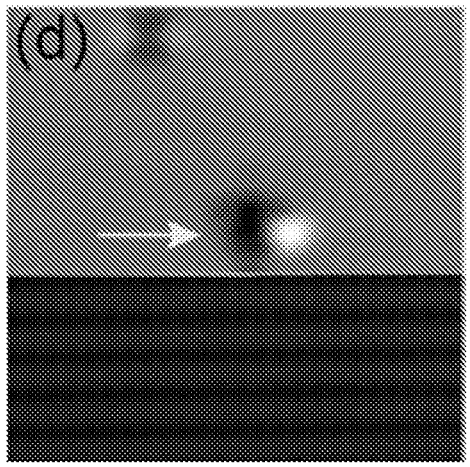
Figure 15A:
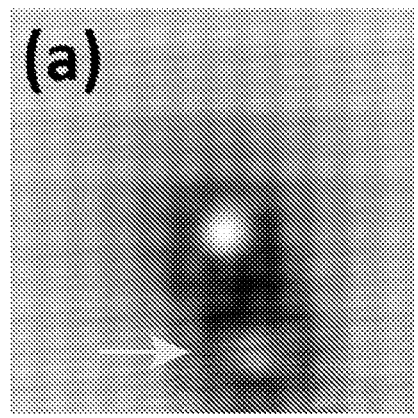
FIG. 15A shows that a single hydrogen atoms physisorbed on the chemically inert H—Si(100) surface could be stably imaged in filled states at low voltage (+1.3 V). However, when the scanning voltage is increased to +1.7V in (b), the hydrogen atom is dragged by the tip which resulted in the capping of the DB during the STM image as indicated by a change in contrast midway through the image and confirmed by a subsequent STM image of the same area as shown in FIG. 15C.
Figure 15B:
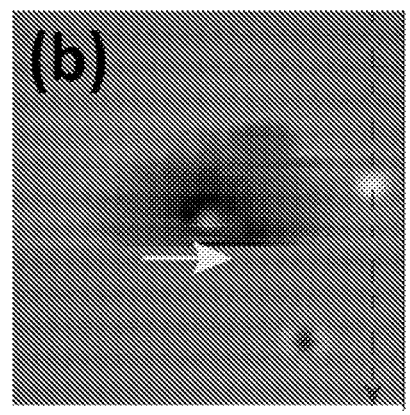
FIGS. 15B and 15C are larger area (10×10) nm² images of the area in FIG. 15A. The location of the atomic hydrogen is marked with an arrow.
Figure 15C:
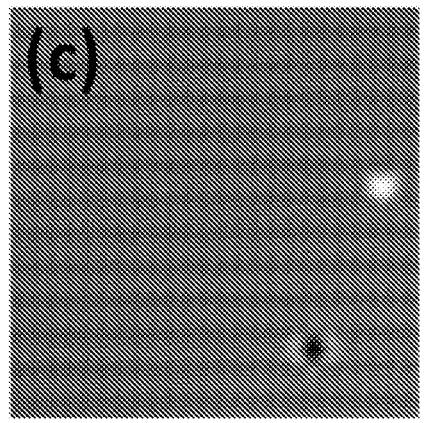

FIG. 11A shows an example of a single hydrogen atom found to be deposited on the H—Si surface immediately after tip induced creation of a DB. Such an object is confirmed to be a single hydrogen atom by dragging it with an elevated positive bias to passivate the created nearby DB (FIGS. 15A-15C). Interestingly, the hydrogen atom appears in empty states STM images as a slightly bright protrusion surrounded by a dark halo as shown in FIG. 11B. This suggests a charging effect that induces a localized band bending similar to a single DB. (14, 16) In the corresponding frequency shift map (FIG. 11C), the physisorbed hydrogen atom appears to induce a lattice distortion of two adjacent dimer pairs. When imaged at relatively high positive voltage (+1.6V in the example of FIG. 2-$f$), the hydrogen atom is picked up by the tip apex as evidenced from the change in STM contrast midway through the scan.

Figure 12A:
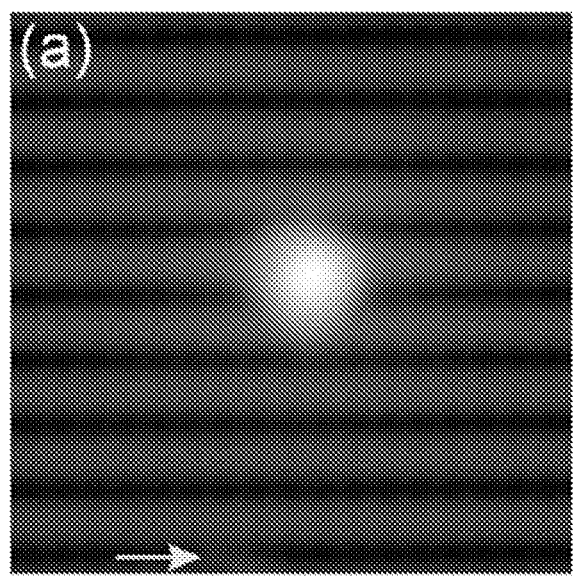
FIGS. 12A-12F show a procedure to mechanically induce a hydrogen-silicon covalent bond.

In the examples of FIGS. 10A-D and 11A-D, the enhanced STM contrast after creating a DB is a first strong indication of tip functionalization with the desorbed single H atom. The contrast changes from resolving dimers (FIG. 10B) to resolving single atoms (FIG. 10D), respectively, before and after the hydrogen desorption from the surface. This is similar to what is well known for the CO molecule, where once it is picked up by the tip apex following a voltage pulse it enhances the STM and AFM contrast.(24, 30, 31) Identification of different tip dynamics is accomplished through studying force curves.(25, 29, 32) Mechanically induced covalent bonding of single hydrogen and silicon atoms. FIG. 12A shows a filled states STM image of the H—Si surface with a silicon DB created using the inventive process. Similar to the case of empty states, an enhanced STM contrast is noticable. In fact, typical filled states STM images of the H—Si surface usually show only dimer rows,(14) but in FIG. 12A the dimers of dimer rows are clearly resolved.

Figure 12B:
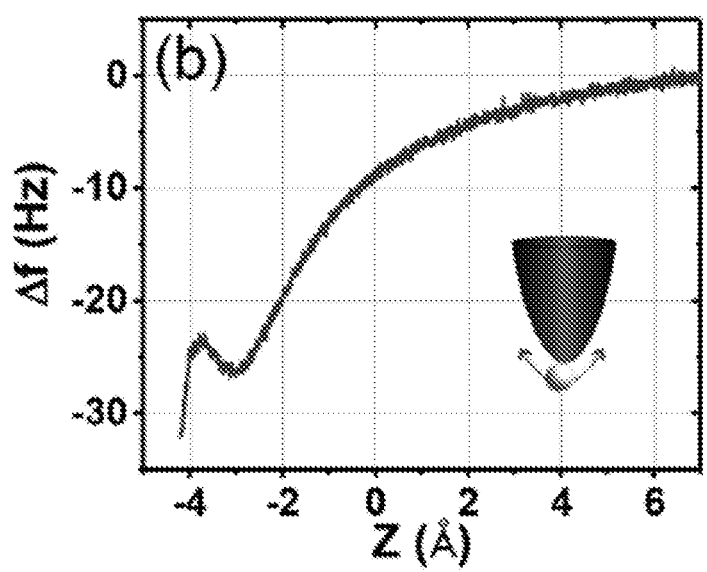

Scanning the single DB of FIG. 12A in AFM scanning mode, FIG. 12B shows a frequency shift vs. displacement curve recorded using a hydrogen functionalized tip on top of a hydrogen atom on the surface. The minima at around −3 Å is always seen when a functionalized tip is prepared following the procedure previously described. Such features are ascribed to the relaxation of the functionalizing atom at the tip apex. (7, 28, 33).

Figure 12C:
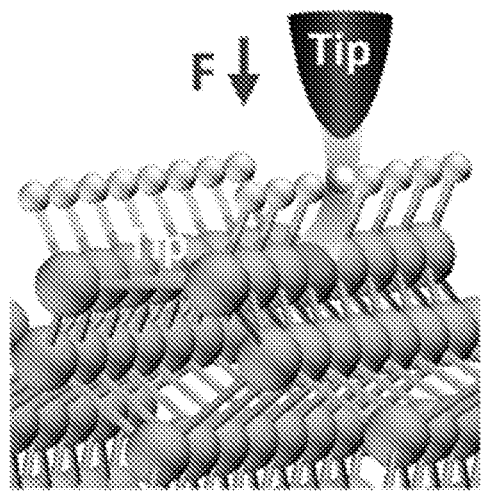
Figure 12D:
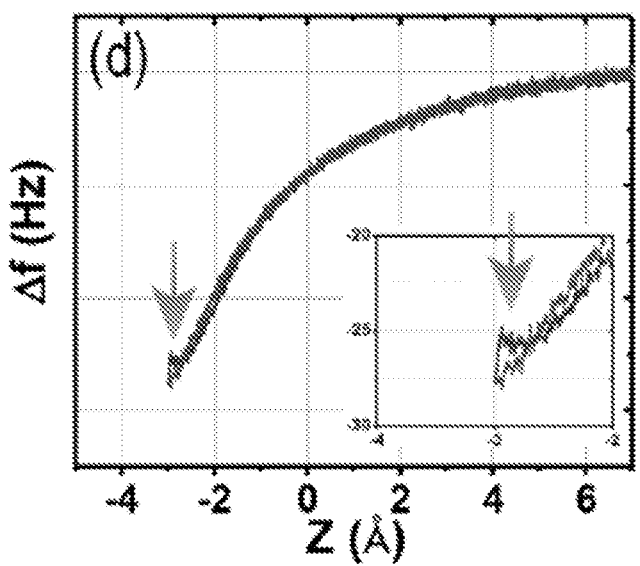
Figure 12E:
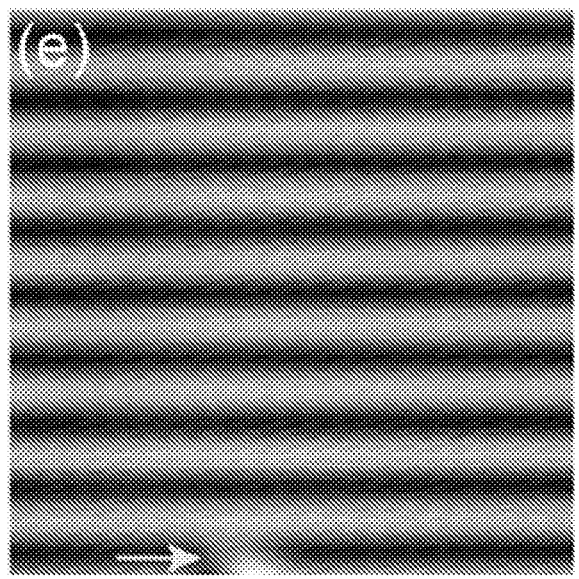
Figure 12F:
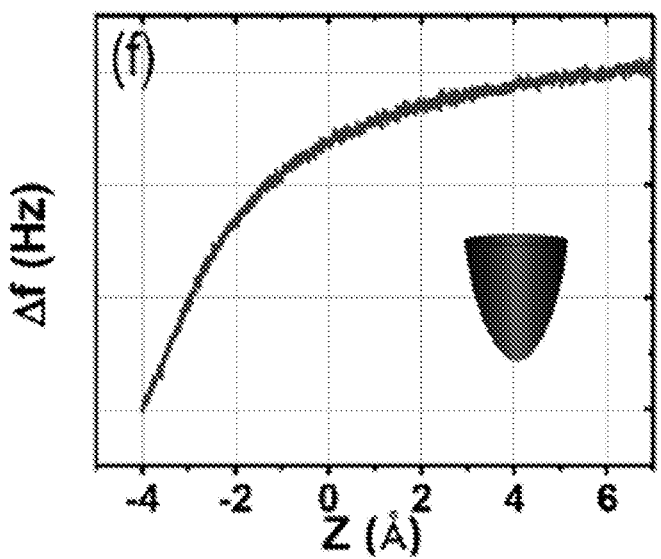

When recorded on a DB using the same functionalized tip, $\Delta f(z)$ curves exhibit a hysteresis between the forward and backward sweep when the tip is brought very close to the DB as shown in FIGS. 12C and 12D, which indicates a change in the AFM junction.(10, 33, 34) When acquiring a subsequent STM image, it is noticed that the DB is capped with a hydrogen atom. The defect indicated by the yellow arrow is used as a marker showing that FIG. 12E is exactly the same area as 12A. Additionally, $\Delta f(z)$ curves recorded on top of a hydrogen atom of the surface as shown in FIG. 12F no longer exhibit the minima characteristic of the hydrogen functionalized tip. This shows that the tip that yields the minima in force curves is indeed functionalized with a single hydrogen atom.

A tip that produces enhanced STM also systematically produces the characteristic force curves with the shallow minima Therefore, change in the STM contrast, such as presented in FIGS. 10D, 11A, and 12A indicates successful functionalization of the tip apex with a single hydrogen atom. This is important for technological applications related to altering DB engineered structures through capping, as changes in STM contrast to detect H-functionalized tips is a much faster indicator than the time-consuming acquisition of $\Delta f(z)$ curves. In fact, regular systematic, non-tip-damaging, and reliable capping is produced using STM contrast as an indicator alone.

All $\Delta f(z)$ curves were recorded at 0 V in the complete absence of tunnel current, and the hydrogen capping of the DB only occurs when the tip is brought to a close enough interaction distance. Therefore, the silicon-hydrogen covalent bonding is mechanically induced. Notably, mechanically induced desorption is also observed, but often results in tip structure changes or multiple hydrogens desorbed, unlike the gentle and precise tip induced desorption. The initial tip apex structure before picking up a hydrogen atom on the tip apex is never exactly the same. So, the H-tip bond is not necessarily the same in all H-functionalized tips, similarly to the case of CO tips. This results in variation on the tip elevation to induce capping. Other factors such as the sensor oscillation amplitude or the $\Delta f(z)$ acquisition parameters also play a role.

In addition to high resolution AFM imaging, H-functionalized tips can be implemented in atom-by-atom lithography to create and modify silicon DB based nanoelectronic elements.

AFM provides an important complementary view to STM works as it allows characterizing the chemical reactivity of DBs. Moreover, unlike STM, AFM allows probing the electronic properties of DBs and DB structures in the band-gap with minimized perturbation from the tip, e.g. minimal tip induced band bending and electron/hole injection.(14, 15)

Figure 13A:
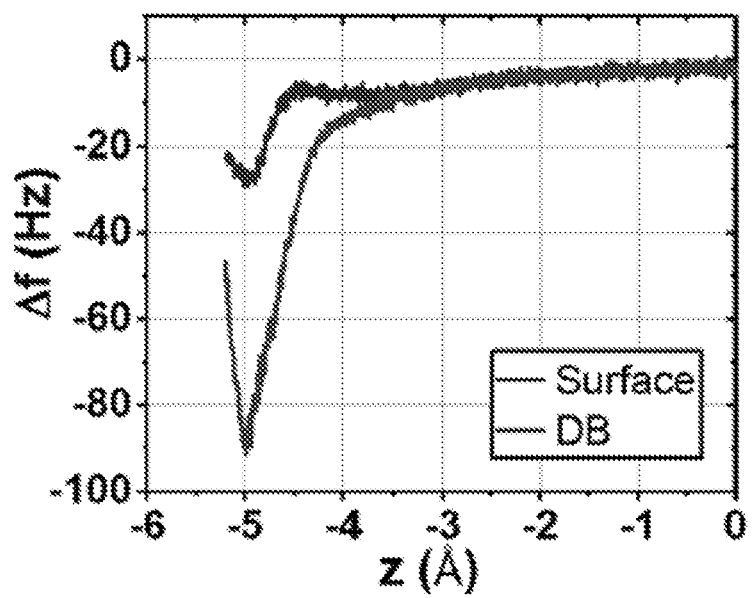
FIGS. 13A-13C show NC-AFM characterization of a single DB on the HSi(100)−2×1 surface using a H-functionalized tip.

FIG. 13A shows force curves acquired using a H-functionalized tip above a surface hydrogen atom (blue curve) and a single silicon DB (red curve). These force curves were recorded subsequently with Z=0 Å corresponding to the tip position defined by the STM imaging set points (30 pA and +1.3 V) before switching off the feedback loop. Hence, superposing the 2 curves allows direct comparison of the interaction force between tip-surface and tip-DB. It is noticed that for relatively large tip-sample distances, the two curves are almost identical. Only for small tip elevations (around −3.5 Å in this example) is a difference seen, with the DB showing a much larger increase in attractive interaction with the tip. This indicates that short range forces are the main contributor to the interaction force. (35) This is also consistent with the DB being a reactive chemical center on the chemically inert H—Si surface where deposited molecules can selectively adsorb.(36, 37) Similar to what was reported previously for the case of gold atoms adsorbed on NaCl over Cu(111),(38, 39) the short range electrostatic force due to the localized negative charge on the DB (11, 13, 14) is most likely the main contributor to the large tip-sample interaction on the DB.

Figure 13B:
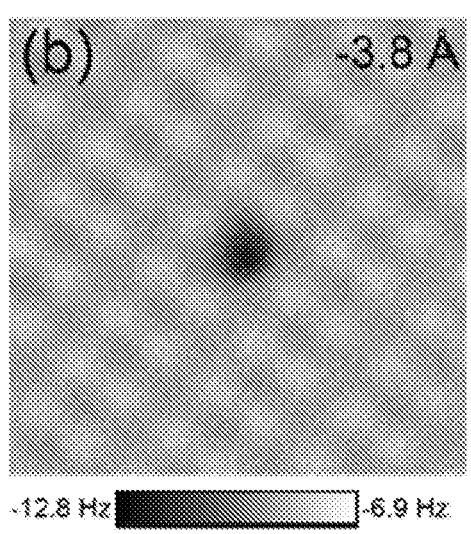
Figure 13C:
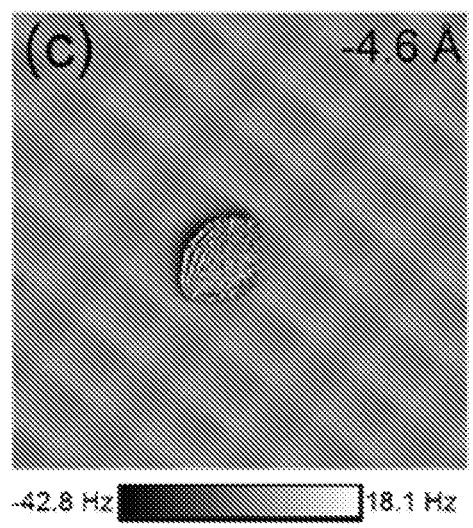

FIGS. 13B and 13C show frequency shift maps acquired at different tip elevations using a H-functionalized tip. At relatively large tip-sample distances (FIG. 13B), each hydrogen atom decorating a silicon atom clearly appears and follows the dimer structure of the 2×1 reconstruction. The DB arising from the desorbed hydrogen atom on the surface appears as a dark atom-sized protrusion, introducing a much higher tip-sample interaction force localized on the DB. Closer to the surface (FIGS. 16A-16E), an evolution from atomic to bond contrast is seen on the H—Si surface as discussed in detail in reference.(29) In FIG. 13C, as a result of the larger attractive forces, the DB appears as an enlarged feature. The perturbations seen inside are an artifact in the excitation channel due to the inability of the feedback loop to maintain a constant oscillation amplitude (FIGS. 17A-17C).

High resolution bond contrast imaging is rendered possible thanks to the passivation of the tip apex with a hydrogen atom. (24, 29) The later can be attracted to form a covalent bond with the silicon DB, but only at very small tip-sample elevations. This shows that the H-functionalized tip is robust and can be used to image reactive adsorbates or surface defects.

Using atom-by-atom lithography with the STM tip, the coupling between DBs can be exploited to create functional DB structures such as QCA circuits, binary wires and logic gates.(11, 12, 17) For large many-atom circuits this necessitates a precise control of desorption, which is difficult to achieve and has not been reported for more than a few DBs so far. Hence, a technique to correct or change multi-DB structures is highly desirable. Additionally, capping DBs allows modulating the engineered quantum states from coupled DBs.(16)

Figure 14A:
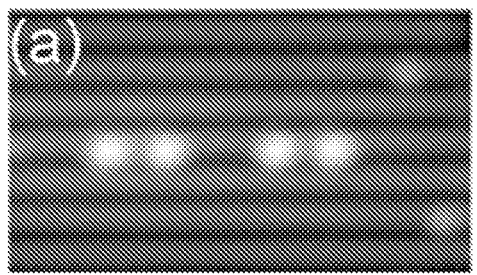
FIGS. 14A-14H show altering coupling and artificial molecular orbitals in multi-DB structures.
Figure 14B:
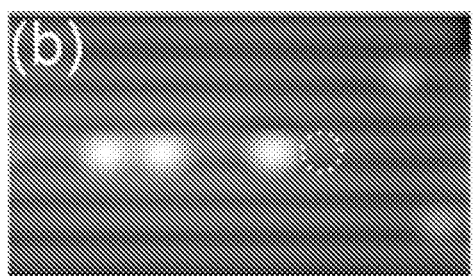

FIG. 14A shows a filled state STM image of two separate pairs of coupled DBs along the same dimer row. Notably, the H-functionalized tip has an enhanced STM contrast characteristic. In FIG. 14B, the right side DB was selectively capped using the mechanically induced H—Si covalent bonding described in the previous section. FIG. 14B shows the change in the STM contrast as previously shown in FIGS. 11 and 12. Additionally, the now single DB on the right side of the image appears as a bright protrusion surrounded with a small dark halo, while the appearance of the two other coupled DBs shows no change.(11)

Figure 14C:
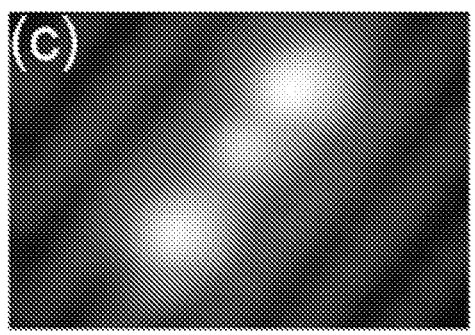
Figure 14D:
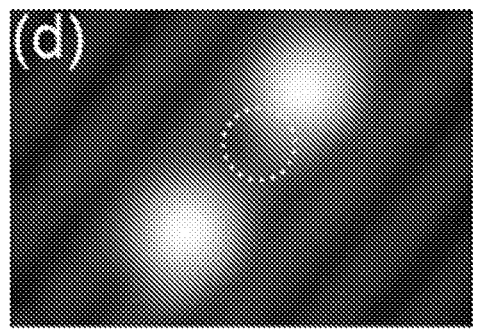

A similar experiment is shown in FIG. 14C where three tunnel coupled DBs are imaged using a H-functionalized tip. The central DB is then erased, the tip re-functionalized by picking up another hydrogen atom, and the remaining two DBs re-imaged in FIG. 14D. Using an equivalent hydrogen tip for the before and after images highlights that changes in brightness are the result of coupling alterations, not simply a change of the terminating atom.

Figure 14E:
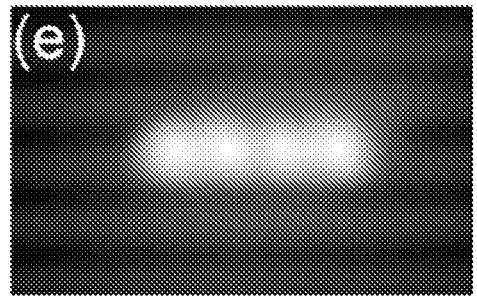
Figure 14F:
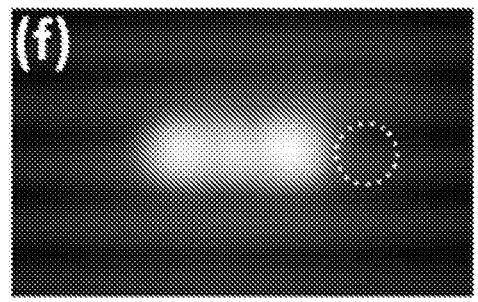
Figure 14G:
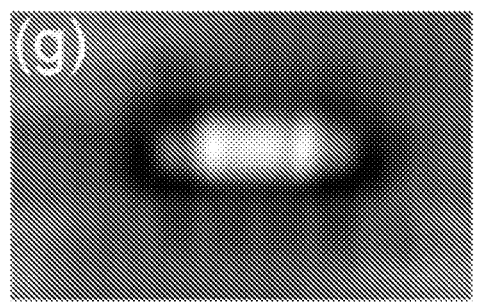
Figure 14H:
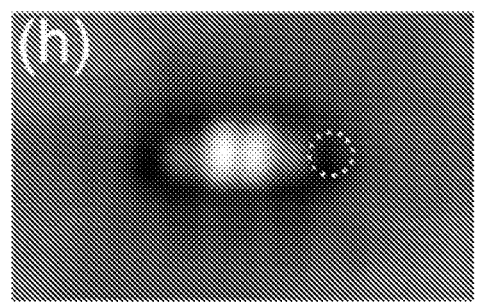
Figure 14I:
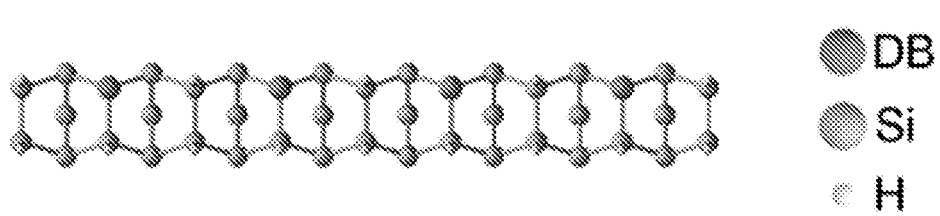
Figure 14J:
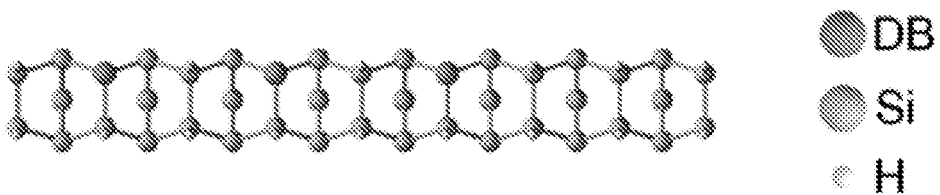

FIG. 14E shows a filled state image of four DBs along the same dimer row with each DB separated by a single H atom as illustrated in the 3D model of FIG. 14F. In the corresponding empty states image (FIG. 14G), a more complex structure is seen with four additional bright protrusions between the visible end atoms. The extra protrusions as an excited state molecular orbital from wave function overlap of multi-DB systems. We show here an active modification of these artificial molecular orbitals through the controlled mechanical covalent bonding of a Si atom (DB) with a hydrogen atom on the tip apex causing nodes to disappear. FIGS. 14F and 14H respectively show the altered filled and empty state molecular orbitals from erasing the far right DB in FIG. 14E. The filled state image shows up as three bright protrusions corresponding to three DBs, whereas the empty state image has been altered to now only have 2 bright protrusions instead of the prior 4. As shown in FIG. 14E to 14H, DB structures are imaged using a non-functionalized tip both before and after alteration. This further highlights that changes in the coupling between DBs visible from the different additional nodes that appear/disappear is not due to changes in the tip, but rather the result of erasing a DB with a hydrogen on the tip apex.

Through the examples of FIG. 14A-14H, it is seen how the controlled mechanically induced H and Si covalent bonding allows the non-destructive editing of a DB structure. This technique could be further applied to actuation of more complicated DB based patterns and elements as well, with erasure of a DB acting as a type of switch.

Experiment 4—Indications of Chemical Bond Contrast in AFM Images

The chemical bond contrast observed is usually interpreted as either the intramolecular structure of molecules or intermolecular bonds. It has been suggested that this contrast arises from the Pauli repulsive force that becomes dominant at small tip-sample distances (1,18). Alternatively, it is based on a classical force field model (9,19), the flexibility of the tip has been claimed to be the dominant effect leading to the chemical bond contrast in AFM images.

The chemical bond contrast when imaging the H-terminated Si(100) surface is consistent with the silicon covalent bond structure of the 2×1 reconstruction. This non-planar surface exhibits various Si—Si and Si—H bonds at different orientations with the H atoms near perpendicular to the surface plane. First, the Si—Si dimer is parallel to the surface plane, providing the first non-adsorbed molecule subject to test the AFM's ability to image bonds. The bond is also uncommonly long, ~2.4 Å compared with <1.5 Å for the carbonaceous species studied to date, allowing the probe greater access to the space between covalently bonded atoms. Termination of the dimer with H atoms forces the constituent silicon atoms to retain an $sp^3$-like character, thereby preventing the dimer from buckling substantially out of the surface plane (24). Another unique feature of the dimer as a specimen for AFM study is its purely 6 bond character. Unlike the π bonds studied to date, the 6 bond decays more sharply in the direction perpendicular to the surface and therefore more nearly approximates the 'stick bond' we schematically draw between covalently bonded atoms. Lastly, the fixed and exactly known proximity of 2 H atoms on two H-terminated dimers aligned end to end (that is two dimers in adjacent dimer rows) provides a wonderful opportunity to test recent conjectures related to false indications of bonds when H-containing molecules are closely juxtaposed.

Following an ex situ cleaning with ebeam and field ion microscopy (FIM), a qPlus sensor with a tungsten tip can be prepared in situ with the hydrogen-terminated silicon surface to obtain either a reactive or a passivated tip, both identified from the typical force curves they generate. Using a density functional tight-binding (DFTB)-based approach efficiently simulates AFM images at precisions on par with DFT.

Figure 18A:
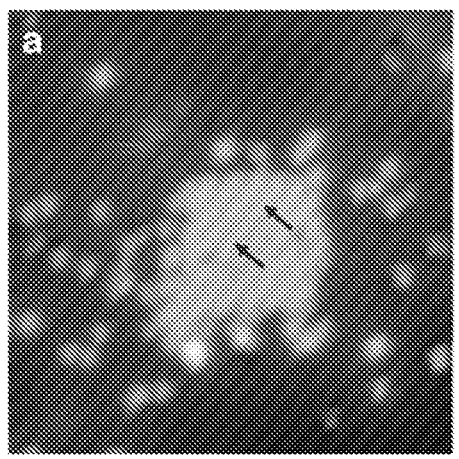
FIGS. 18A-18D show a method of making and identifying a hydrogen-passivated tip according to the present invention.

Implementing the ex situ tip cleaning procedure using ebeam and FIM, results in scanning tunnelling microscopy (STM) atomic resolution of the surface right after the approach. However, images often exhibit artifacts, such as a double/multiple tip as seen in FIG. 18A, that renders data interpretation inaccurate. Therefore, it is necessary to further process the tip by in situ techniques to obtain a single atom tip apex. When studying metal surfaces, this is usually done by applying large voltage pulses and harsh indentation of the tip into the surface, followed by functionalizing the tip using a molecule such as CO'. A gentle procedure that gives stable tips without ravaging the studied surface area is used.

Figure 18B:
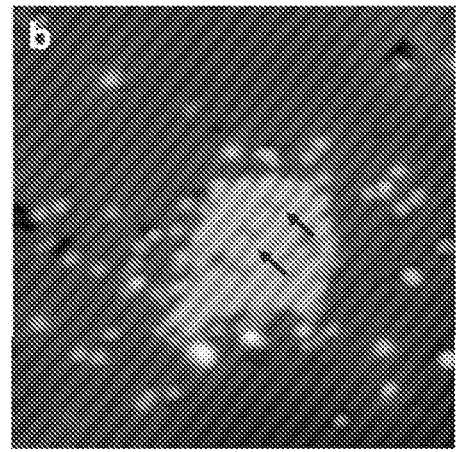

The method starts by bringing the tip in controlled contact with the silicon surface, which produces a silicon tip apex (26). A bare silicon area is then created on the H—Si(100) surface by tip-induced hydrogen desorbtion (27-29). In the example of FIG. 18A, a (5×5) nm$^2$ square area is created by scanning at 4V and 150 pA for about 6 min, coating the silicon tip apex with hydrogen. The tip is then brought close to the bare silicon area before a new STM image is acquired to check possible tip changes. This procedure is repeated until a sharp artifact-free STM image of the surface is obtained as shown in FIG. 18B. The small dark features indicated by red arrows in FIG. 18B are H-terminated silicon dimers created after the above tip preparation and H termination process was complete. The tip was positioned over a hydrogen-free dimer, then moved ~6 Å closer to the surface. Reimaging revealed the newly H-terminated dimer. Similarly, prepared H-terminated dimers have been previously described (30). This capping of silicon dimers with H atoms was done to indicate the presence of multiple H atoms on the tip as a result of the H desorption preparation process.

Figure 18C:
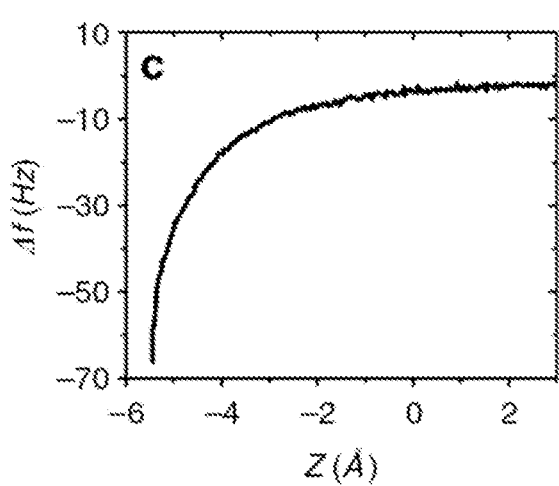
Figure 18D:
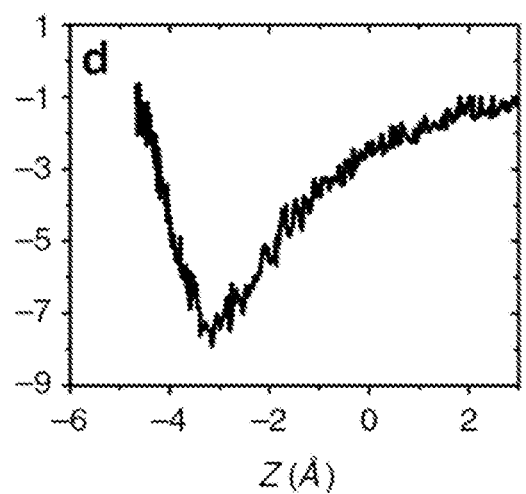

The passivated character of the tip is further confirmed using force spectroscopy. Typical force curves of the H—Si surface acquired before the hydrogen desorption procedure, as in the example of FIG. 18C, clearly show a very reactive character. On the other hand, force curves acquired afterwards, as in FIG. 18D, show a passivated character. This is reminiscent of the difference observed between reactive metal tips and CO-passivated tips (23,31). Approaching the H-passivated tip very close to the surface can result in changing the tip back to reactive. Therefore, it is possible to switch between reactive and passivated tips.

Figure 19A:
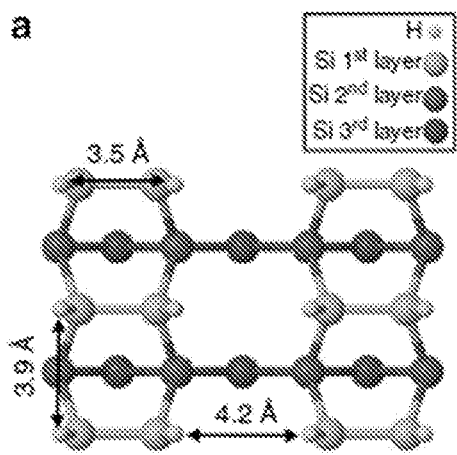
FIGS. 19A-19H show a series of frequency shift maps at different tip elevations.
Figure 19B:
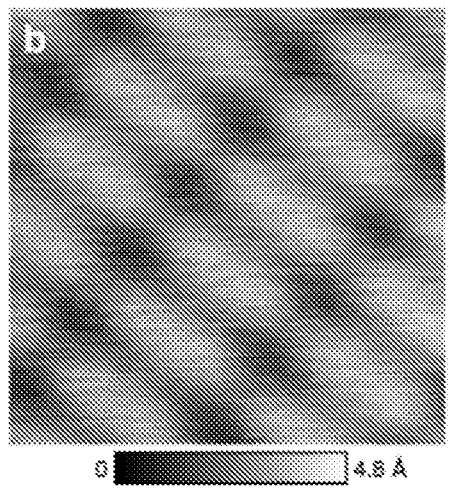
Figure 19C:
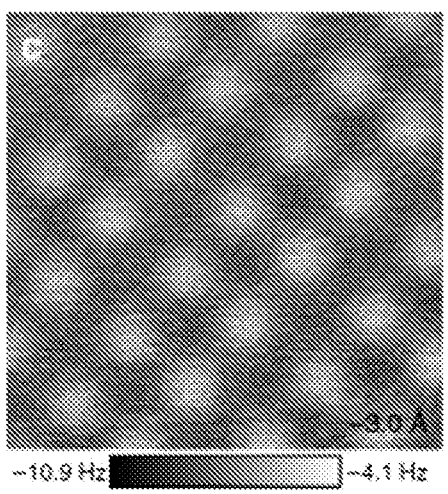
Figure 19D:
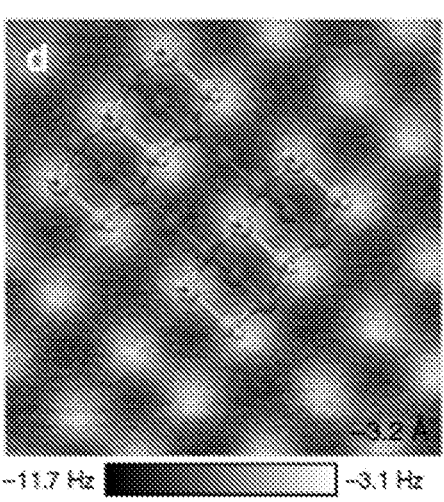

FIG. 19A presents a ball and stick model of the H—Si (100)–2×1 surface structure where the different 6 bonds between silicon atoms, in particular the dimer bonds parallel to the surface plane and also the silicon back bonds can be seen. Using a stable passivated tip obtained following the method described above, a small defect-free area can be imaged in STM as in FIG. 19B. The feedback loop is then switched off, the bias set to 0V and the scanner switched to AFM scanning mode. The tip position defined by the STM imaging set points before switching off the feedback loop is taken as a reference, that is, Z=A. FIG. 2c-h shows a series of AFM frequency shift maps at different elevations. Since these images are taken in constant height mode, more repulsive tip-sample interactions appear brighter. In this example, substantial contrast starts to be visible at Z=−3.0 Å (FIG. 19C) where we clearly see single atoms appearing as a bright protrusion and organized in a clear 2×1 reconstruction. As the tip is brought closer to the surface by 0.2 Å in FIG. 19C, the signal to noise is improved and the atomic contrast is clearer. Superimposing the surface model to the AFM image allows us to further highlight that, at this tip-sample distance, only the hydrogenated silicon atoms are visible.

Figure 19E:
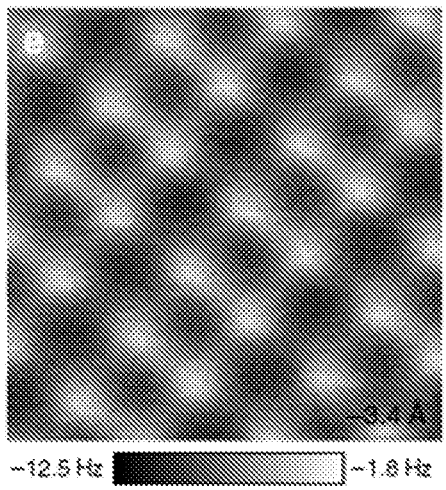

However, as the tip-sample distance is decreased, bright and sharp bond-like features appear between atoms of a dimer as clearly seen in FIG. 19E at Z=−3.4 Å. These features appear to be due to the silicon dimer bonds. In addition, one notices features consistent with the back-bonds between dimer and second layer silicon atoms in accordance with the surface model in FIG. 19A. Although this surface was previously investigated both experimentally (32,33) and theoretically (34,35) using NC-AFM, the evolution toward images consistent with the known bond structure as reported here is unprecedented.

Figure 19F:
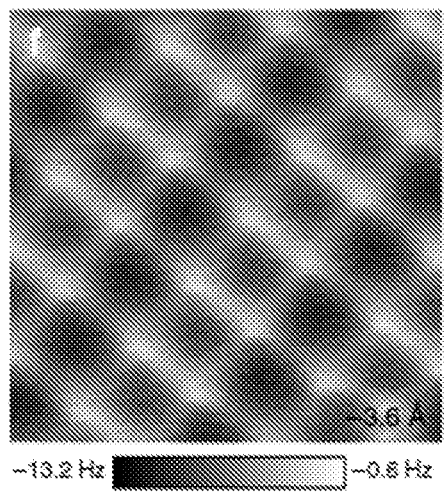
Figure 19G:
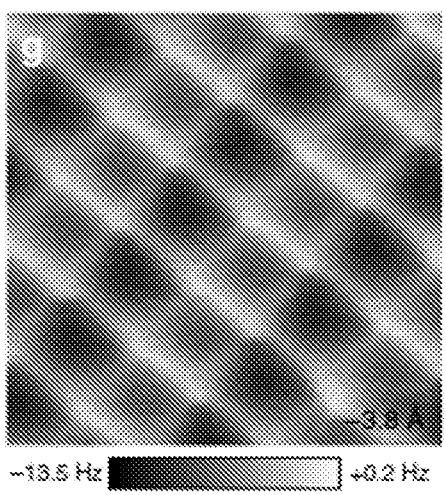
Figure 19H:
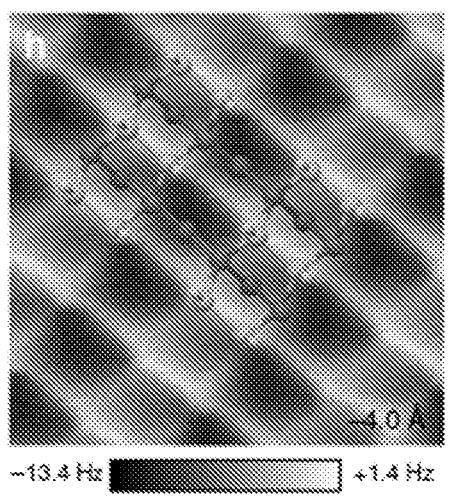

Interestingly, when decreasing the tip elevation to Z=−3.6 Å in FIG. 19F, it is seen that in addition to the intra-silicon contrast enhancement, new sharp features appear in the inter-silicon dimer row region between two hydrogen atoms. These appear more pronounced in FIGS. 19G and 19H. Unlike what appears to be the bond contrast corresponding to the silicon dimer bond, the feature in the inter-dimer region does not correspond to a real chemical bond as can be understood from the ball and stick model of the silicon surface (FIG. 19H). Moreover, the model shows that this AFM feature also does not correspond to the position of third-layer silicon atoms.

Notably, tip and substrate geometries are altered during imaging, especially at very small tip heights. To determine the unperturbed substrate structure, it is necessary to create a candidate structure and subject that to a simulated imaging process at a range of tip heights. Simulations done in this way capture force-induced alterations of structure and thereby result in modelled images that can be compared with experiment.

To simulate AFM images, it is important to choose a correct level of theory to properly consider the necessary undergoing physics and chemistry while keeping the calculations tractable. In addition, the atomistic definition of tip and substrate is a requirement in many cases. Among first-principle frameworks, DFT is the first choice, especially when dispersion correction has been considered to include the small long-range forces at large tip-sample separations. Unfortunately, DFT is computationally expensive for many systems, especially those where imaging must be done for a bulk structure, not only a molecule. Here DFTB is used, which at a lower computational cost can provide results comparable with DFT using traditional semi-local functionals for the silicon-based systems (36).

Figure 20A:
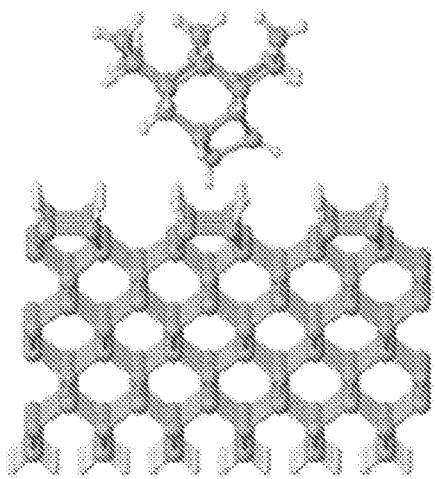
FIGS. 20A-20C show simulated force maps from DFTB calculations.

The modelled system is shown in FIG. 20A. The pyramid-like reconstructed structure considered for the tip ends with a tilted passivated silicon dimer so that the apex is a hydrogen atom. This tip consists of silicon and hydrogen atoms as an approximation to the passivated AFM tip used in this work. Similar model tips, called 'dimer tip', have been previously studied in the literature and satisfactory results have been reported (13,37,38). Here we placed more bulk structures at the base of the tip which, along with the hydrogen passivation of the silicon dangling bonds, result in higher stability. This structure can be geometrically optimized by various ab initio methods without the need to freeze the base atoms which leads to an unstrained structure increasing the fidelity of the forces read on the tip atoms.

For the substrate, a super-cell consisting of a H—Si(100)–2×1 silicon slab containing three dimer rows with six dimers per row is used. The slab consists of 10 silicon layers with the bottom one terminated with hydrogen atoms. The lowermost two silicon layers of the slab and the uppermost silicon atoms of the tip, along with their passivating hydrogens, are fixed to allow the constant height criteria of AFM. The rest of the atoms are relaxed to a force threshold of 0.02 eV/A.

Figure 20B:
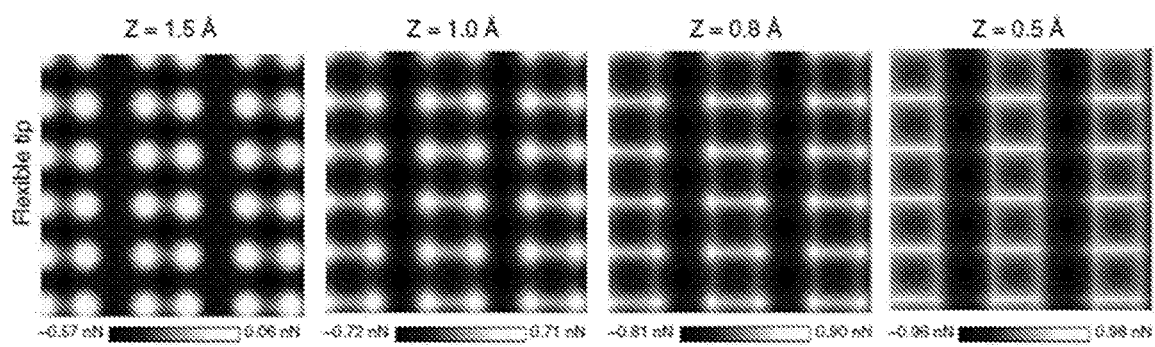

Initially, the tip has been placed at different elevations with respect to the substrate. The height is measured as the distance between the topmost substrate atom and the lowermost tip atom. The forces on the tip atoms are read after the relaxation, then the tip is shifted by 0.1 Å in x- or y-direction for the next point calculation. The scans at each tip elevation are performed from one hydrogen atom, to the next equivalent hydrogen atoms along and across the dimer rows. At each elevation, there were about 3,000 geometry optimization calculations with the results shown in FIG. 20B.

In good agreement with the experimental results, it is seen that at higher tip elevations, the dimer atoms appear as bright protrusions. As the tip approaches the surface, the atomic features start to dim while features in the silicon dimer bond region start to appear. Finally, at very low elevation (0.5 Å), an apparent dimer bond and its constituent atoms are indistinguishable. In addition, it is noticed that the false bond feature in the interdimer region appearing at lower tip elevation images, similar to the experimental results.

Figure 20C:
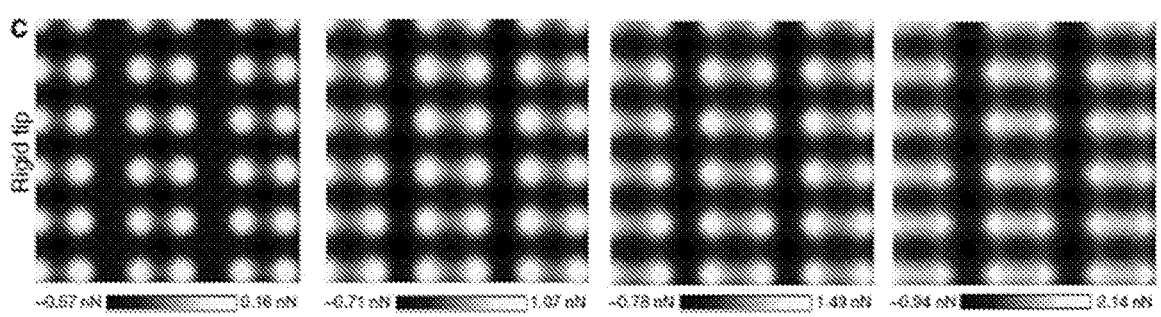

Next, the effect of tip flexibility in the imaging of this surface and also in enhancing the AFM topographic feature registered between adjacent dimers in different dimer rows is discussed, where it is known with certainty that there is no hydrogen bond or covalent bond. Atomistic modelling can provide useful insights in this regard. In the simulations, tip flexibility plays a significant role. That role is resolved by restricting some structural relaxations. Additional sets of simulations are performed by fixing all of the tip atoms while letting the surface atoms of the substrate relax as before. The results are shown in FIG. 20C where one sees a thicker feature in the dimer bond region and bright atomic protrusions even at low tip elevation, which is different from the experiment. This is due to the lower freedom of movement for the rigid tip which causes stronger forces to be read on it. As a result, the bond contrast is somewhat lowered. Nevertheless, it shows what appears to be a bond contrast where we know the Si—Si bond is located. This shows that although the tip flexibility is not necessary to observe a chemical bond-like contrast over the dimer, it certainly enhances such contrast. In addition, the tip flexibility makes the inter-dimer contrast more visible. This is reminiscent of the debate in the literature about the role of the CO molecule flexibility to account for contrast due to bonds within molecules and between molecules (9,10,16,17,22).

Figure 21A:
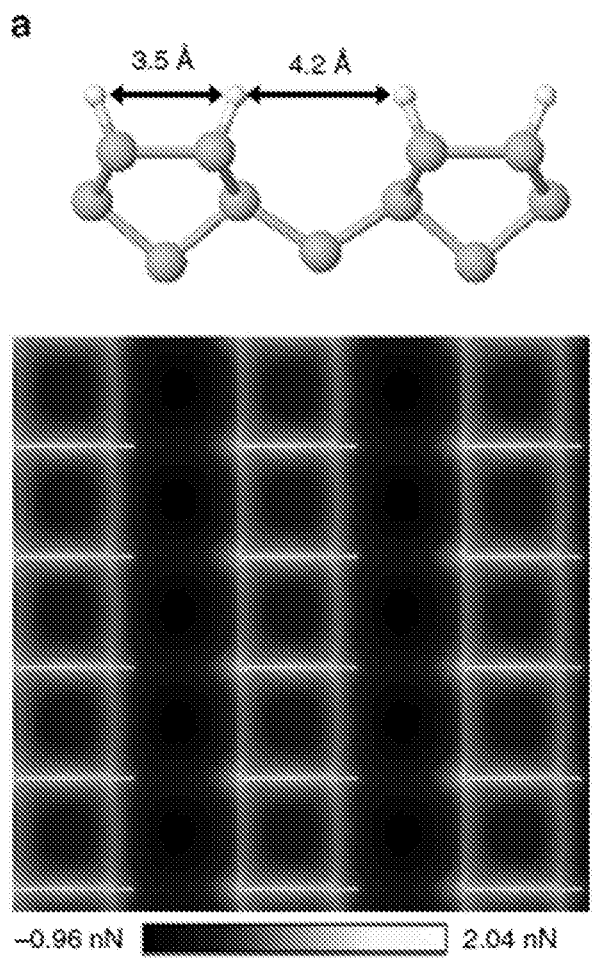
FIGS. 21A and 21B show simulated force maps for frozen slabs. Partial side view of the frozen slabs (upper panels) along with their simulated force maps (lower panels). In a, the dimer hydrogens are fixed in their relaxed positions, while in FIG. 21B they are slightly bent and fixed to obtain reverse distances between dimer and interdimer hydrogens with respect to FIG. 21A.
Figure 21B:
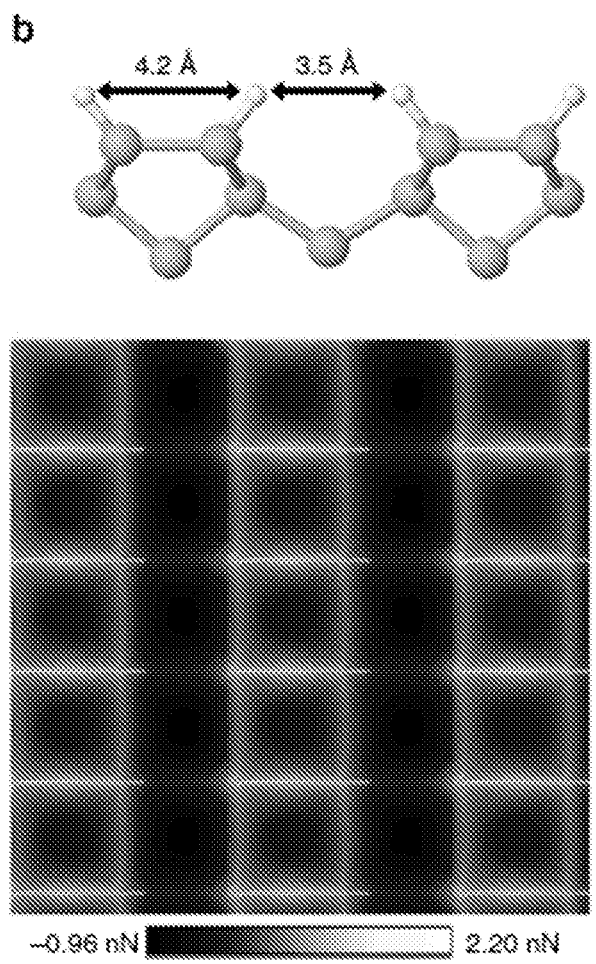

To highlight the difference in the high-resolution AFM images between features corresponding to real chemical bonds and those appearing in the silicon inter-dimer region, additional calculation results are presented using two different systems. The calculations are done at a very low tip elevation. In these cases, the tip is flexible, but the substrate is frozen. In the first system, the substrate is as before with the atoms frozen at the relaxed positions. In the second system, the dimer hydrogens are bent slightly, while keeping their bond length at the equilibrium value (that is, 1.5 Å) so that the distances between dimer and inter-dimer hydrogens are reversed with respect to the equilibrium case, as shown in FIGS. 21A and 21B. This gives us the opportunity to investigate whether the AFM chemical bond contrast is dominantly due to the Si—Si bonds, or it is more a consequence of the flexible tip scanning over closely spaced H atoms.

In the first system, what appears to be dimer bonds are visible as before, although some contrast is compromised due to the rigidity of the substrate. Interestingly, in the second system, the image contrast is still much sharper above the Si—Si dimer bond, despite the H—H distance being shorter in the inter-dimer region than over the dimer. If the feature seen in the dimer bond region were an artifact due to a convolution of a flexible tip with the H atoms attached to the dimer, one would see the dimer bond-like feature be diminished upon separating the H atoms as was done. Moreover, a stronger feature would be seen in the inter-row region than above the dimer, which is clearly not the case. This provides shows that H—H orbital overlap is not the main contributor to the intradimer bond features seen in the experiment. We note again at this point that, unlike other surface parallel bonded atoms imaged to date, these are 6 bonded and not a π bonded atoms.

Furthermore, the results from FIG. 21B help explain the origin of the back-bond features seen in the experimental and theoretical AFM images at lower elevations. As shown in this figure, the distance between the intra-dimer hydrogens is 3.5 Å, which is less than the 3.9 Å between adjacent H atoms on different dimer rows. Yet, it is possible to still see much more prominent image features where the silicon back-bonds are expected (FIG. 19A). It appears, within the calculations, that the silicon atoms and possibly the Si—Si 6 bonds are the major contributor for the bond feature contrast corresponding to the back-bonds, and that the H—H overlap plays a minor role here.

To summarize, the present inventions establishes that a hydrogen-passivated tip can be reliably prepared and identified. This passivated tip is used to image the H—Si(100)-2×1 surface. Using a DFTB-based approach to AFM simulation, the evolution of AFM images at different tip elevations are successfully reproduced. It is shown that tip flexibility enhances and sharpens the appearance in AFM images of what are known to be true covalent bonds. Moreover, it is shown that non-bonded atoms in close proximity can appear bonded, and that false impression is enhanced by tip flexibility.

References cited herein are incorporated by reference to the same extent as if each reference was individually and explicitly incorporated by reference.

As a person skilled in the art will recognize from the previous detailed description and from the figures and claims, modifications and changes can be made to the preferred embodiments of the invention without departing from the scope of this invention defined in the following claims.

The invention claimed is:

1. A multiple-atom silicon quantum dot comprising:
    a first plurality of dangling bonds on an otherwise H-terminated silicon lattice surface, each of said first plurality of dangling bonds having one of three ionization states of +1, 0 or −1 and corresponding respectively to 0, 1, or 2 electrons in a dangling bond state;
    said first plurality of dangling bonds being as close together as the silicon lattice allows and having the dangling bond states energetically in the silicon band gap with selective control of the ionization state of one of said first plurality of dangling bonds.

2. The dot of claim 1 wherein said first plurality of dangling bonds is three to ten dangling bonds.

3. The dot of claim 1 wherein said first plurality of dangling bonds is more than ten dangling bonds.

4. The dot of claim 1 wherein said first plurality of dangling bonds are linear.

5. The dot of claim 1 wherein said first plurality of dangling bonds are on adjacent H-terminated silicon atoms.

6. The dot of claim 1 wherein there is at least one H-terminated silicon atom intermediate between said first plurality of dangling bonds.

7. The dot of claim 1 further comprising a second plurality of dangling bonds on an otherwise H-terminated silicon lattice surface, each of said second plurality of dangling bonds having one of three ionization states of +1, 0, or −1 and corresponding respectively to 0, 1, or 2 electrons in a dangling bond state, said second plurality of dangling bonds being as close together as the silicon lattice allows and having the dangling bond states energetically in the silicon band gap with selective control of the ionization state of one of said second plurality of dangling bonds.

8. The dot of claim 7 wherein the second plurality of dangling bonds includes 2 to 10,000 dangling bonds.

9. The dot of claim 7 wherein the second plurality of dangling bonds is positioned parallel to the first plurality of dangling bonds.

10. The dot of claim 7 wherein the second plurality of dangling bonds is positioned perpendicular to the first plurality of dangling bonds.

11. The dot of claim 7 wherein the second plurality of dangling bonds is positioned at an angle of 120° to the first plurality of dangling bonds.

12. The dot of claim 7 wherein the H-terminated silicon lattice surface is one of Si(111), Si(110), or Si(100).

13. The dot of claim 7 wherein the first plurality of dangling bonds and the second plurality of dangling bonds form a V-shape on the H-terminated silicon lattice surface.

14. The dot of claim 7 further comprising a third plurality of dangling bonds, wherein the first, second, and third pluralities of dangling bonds form a triangle shape or a Y-shape on the H-terminated silicon lattice surface.

15. The dot of claim 7 further comprising a third plurality of dangling bonds and a fourth plurality of dangling bonds, wherein the first, second, third, and fourth pluralities of dangling bonds form a square shape or a rectangular shape on the H-terminated silicon lattice surface.

16. The dot of claim 7 further comprising an input and an output.

17. The dot of claim 7 further comprising an AFM tip as an input and a third plurality of dangling bonds, wherein the first, second, and third pluralities of dangling bonds form a Y-shape on the H-terminated silicon lattice surface.

18. The dot of claim 17 wherein the input and an output form a gate.

19. The dot of claim 18 wherein the gate is an OR gate.

20. The dot of claim 7 further comprising an electrostatic bias positioned at an end of the dot to allow the dot to return to a state of equilibrium.

21. The dot of claim 7 wherein the dot is capable of performing clocking function on the order of every $<10^{-13}$ seconds.

22. The dot of claim 1 wherein a doping level of the dot is adjusted such that the dot has a neutral charge.

23. The dot of claim 1 wherein the dot is encapsulated.

24. The dot of claim 1 wherein said first plurality of dangling bonds are surrounded by silicon atoms that are H atom terminated.

25. The dot of claim 1 wherein said first plurality of dangling bonds form a wire with a perturbation at a first end communicated to an opposing end to the first end.

26. An electronic device comprising:
   at least one multiple-atom silicon quantum dot of claim 1; and
   at least one contact in electronic communication with the at least one multiple-atom silicon quantum dot.

* * * * *